(12) United States Patent
Kister

(10) Patent No.: US 7,659,739 B2
(45) Date of Patent: Feb. 9, 2010

(54) KNEE PROBE HAVING REDUCED THICKNESS SECTION FOR CONTROL OF SCRUB MOTION

(75) Inventor: January Kister, Portola Valley, CA (US)

(73) Assignee: Micro Porbe, Inc., Carlsbad, CA (US)

( * ) Notice: Subject to any disclaimer, the term of this patent is extended or adjusted under 35 U.S.C. 154(b) by 0 days.

(21) Appl. No.: 11/521,944

(22) Filed: Sep. 14, 2006

(65) Prior Publication Data
US 2008/0068035 A1 Mar. 20, 2008

(51) Int. Cl.
*G01R 31/02* (2006.01)
(52) U.S. Cl. .................................... 324/761; 324/754
(58) Field of Classification Search .................. None
See application file for complete search history.

(56) References Cited

U.S. PATENT DOCUMENTS

| | | | |
|---|---|---|---|
| 3,518,612 A | 6/1970 | Dunman et al. | |
| 3,599,093 A | 8/1971 | Oates | |
| 3,710,251 A | 1/1973 | Hagge et al. | |
| 3,812,311 A | 5/1974 | Kvaternik | |
| 4,027,935 A * | 6/1977 | Byrnes et al. | 439/289 |
| 4,115,736 A | 9/1978 | Tracy | |
| 4,116,523 A | 9/1978 | Coberly et al. | |
| 4,423,376 A | 12/1983 | Byrnes et al. | |
| 4,525,697 A | 6/1985 | Jones et al. | |
| 4,532,423 A | 7/1985 | Tojo et al. | |
| 4,593,961 A | 6/1986 | Cosmo | |
| 4,618,767 A | 10/1986 | Smith et al. | |
| 4,618,821 A | 10/1986 | Lenz | |
| 4,706,019 A | 11/1987 | Richardson | |
| 4,730,158 A | 3/1988 | Kasai et al. | |
| 4,747,698 A | 5/1988 | Wickramasinghe et al. | |
| 4,757,255 A | 7/1988 | Margozzi | |
| 4,772,846 A | 9/1988 | Reeds | |
| 4,773,877 A | 9/1988 | Kruger et al. | |

(Continued)

FOREIGN PATENT DOCUMENTS

EP 0764352 5/2004

(Continued)

OTHER PUBLICATIONS

Sporck, Nicholas, "A New Probe Card Technology Using Compliant Microsprings", *Proceedings 1997 IEEE International Test Conference* Nov. 1, 1997, pp. 527-532.

*Primary Examiner*—Vinh P Nguyen
(74) *Attorney, Agent, or Firm*—Samantha A. Updegraff; Deborah A. Oeacock; Robert Lodenkamper

(57) ABSTRACT

An improved knee probe for probing electrical devices and circuits is provided. The improved knee probe has a reduced thickness section to alter the mechanical behavior of the probe when contact is made. The reduced thickness section of the probe makes it easier to deflect the probe vertically when contact is made. This increased ease of vertical deflection tends to reduce the horizontal contact force component responsible for the scrub motion, thereby decreasing scrub length. Here "thickness" is the probe thickness in the deflection plane of the probe (i.e., the plane in which the probe knee lies). The reduced thickness probe section provides increased design flexibility for controlling scrub motion, especially in combination with other probe parameters affecting the scrub motion.

42 Claims, 29 Drawing Sheets

U.S. PATENT DOCUMENTS

| | | |
|---|---|---|
| 4,807,159 A | 2/1989 | Komatsu et al. |
| 4,901,013 A | 2/1990 | Benedetto et al. |
| 4,967,148 A | 10/1990 | Doemens et al. |
| 5,015,947 A | 5/1991 | Chism |
| 5,026,291 A | 6/1991 | David |
| 5,030,318 A | 7/1991 | Reche |
| 5,145,384 A | 9/1992 | Asakawa et al. |
| 5,205,739 A | 4/1993 | Malo et al. |
| 5,207,585 A | 5/1993 | Byrnes |
| 5,230,632 A | 7/1993 | Baumberger et al. |
| 5,354,205 A | 10/1994 | Feigenbaum et al. |
| 5,422,574 A | 6/1995 | Kister |
| 5,430,614 A | 7/1995 | Difrancesco |
| 5,436,571 A | 7/1995 | Karasawa |
| 5,531,022 A | 7/1996 | Beaman et al. |
| 5,576,631 A | 11/1996 | Stowers et al. |
| 5,632,631 A | 5/1997 | Fjelstad et al. |
| 5,635,846 A | 6/1997 | Beaman et al. |
| 5,644,249 A | 7/1997 | Kister |
| 5,676,599 A | 10/1997 | Ricks et al. |
| 5,720,098 A | 2/1998 | Kister |
| 5,742,174 A | 4/1998 | Kister et al. |
| 5,751,157 A | 5/1998 | Kister |
| 5,764,070 A | 6/1998 | Pedder |
| 5,764,072 A | 6/1998 | Kister |
| 5,764,409 A | 6/1998 | Colvin |
| 5,767,691 A | 6/1998 | Verkuil |
| 5,773,987 A | 6/1998 | Montoya |
| 5,802,699 A | 9/1998 | Fjelstad et al. |
| 5,806,181 A | 9/1998 | Khandros et al. |
| 5,832,601 A | 11/1998 | Eldridge et al. |
| 5,884,395 A | 3/1999 | Dabrowiecki et al. |
| 5,892,539 A | 4/1999 | Colvin |
| 5,914,613 A | 6/1999 | Gleason et al. |
| 5,917,707 A | 6/1999 | Khandros et al. |
| 5,923,178 A * | 7/1999 | Higgins et al. ............... 324/754 |
| 5,932,323 A | 8/1999 | Throssel |
| 5,934,914 A | 8/1999 | Fjelstad et al. |
| 5,936,421 A | 8/1999 | Stowers et al. |
| 5,945,836 A | 8/1999 | Sayre et al. |
| 5,952,843 A | 9/1999 | Vinh |
| 5,970,167 A | 10/1999 | Colvin |
| 6,027,630 A | 2/2000 | Cohen |
| 6,064,215 A | 5/2000 | Kister |
| 6,071,630 A | 6/2000 | Tomaru et al. |
| 6,086,386 A | 7/2000 | Fjelstad et al. |
| 6,133,072 A | 10/2000 | Fjelstad |
| 6,204,674 B1 | 3/2001 | Dabrowiecki |
| 6,205,660 B1 | 3/2001 | Fjelstad et al. |
| 6,218,203 B1 | 4/2001 | Khoury et al. |
| 6,246,245 B1 | 6/2001 | Akram et al. |
| 6,247,228 B1 | 6/2001 | Distefano et al. |
| 6,278,284 B1 | 8/2001 | Mori et al. |
| 6,292,003 B1 * | 9/2001 | Fredrickson et al. ........ 324/754 |
| 6,344,753 B1 | 2/2002 | Takada et al. |
| 6,411,112 B1 | 6/2002 | Das et al. |
| 6,419,500 B1 | 7/2002 | Kister |
| 6,420,887 B1 | 7/2002 | Kister et al. |
| 6,424,164 B1 | 7/2002 | Kister |
| 6,433,571 B1 | 8/2002 | Montoya |
| 6,441,315 B1 | 8/2002 | Eldridge et al. |
| 6,443,784 B1 | 9/2002 | Kimoto |
| 6,482,013 B2 | 11/2002 | Eldridge et al. |
| 6,486,689 B1 | 11/2002 | Nishikawa |
| 6,525,552 B2 | 2/2003 | Kister |
| 6,529,021 B1 | 3/2003 | Yu |
| 6,530,148 B1 | 3/2003 | Kister |
| 6,570,396 B1 | 5/2003 | Kister |
| 6,573,738 B1 | 6/2003 | Matsuo et al. |
| 6,575,767 B2 * | 6/2003 | Satoh et al. ................... 439/71 |
| 6,576,485 B2 | 6/2003 | Zhou et al. |
| 6,633,176 B2 | 10/2003 | Takemoto et al. |
| 6,677,245 B2 | 1/2004 | Zhou et al. |
| 6,707,311 B2 | 3/2004 | Hohenwarter |
| 6,727,719 B2 | 4/2004 | Liao et al. |
| 6,731,123 B2 | 5/2004 | Kimoto |
| 6,765,228 B2 | 7/2004 | Lin et al. |
| 6,842,023 B2 | 1/2005 | Yoshida et al. |
| 6,847,221 B2 | 1/2005 | Kimoto et al. |
| 6,853,208 B2 | 2/2005 | Okubo et al. |
| 6,890,185 B1 | 5/2005 | Kister et al. |
| D507,198 S | 7/2005 | Kister |
| 6,917,525 B2 | 7/2005 | Mok et al. |
| D510,043 S | 9/2005 | Kister |
| 6,956,389 B1 | 10/2005 | Mai |
| 6,965,245 B2 | 11/2005 | Kister et al. |
| 6,970,005 B2 | 11/2005 | Rincon |
| 7,015,707 B2 | 3/2006 | Cherian |
| 7,046,021 B2 | 5/2006 | Kister |
| 7,059,865 B2 | 6/2006 | Kister et al. |
| 7,064,564 B2 | 6/2006 | Kister et al. |
| D525,207 S | 7/2006 | Kister et al. |
| 7,078,921 B2 | 7/2006 | Haga et al. |
| 7,091,729 B2 | 8/2006 | Kister |
| 7,109,731 B2 | 9/2006 | Gleason et al. |
| 7,148,709 B2 | 12/2006 | Kister |
| 7,150,658 B1 | 12/2006 | Chien |
| 7,202,682 B2 | 4/2007 | Cooper et al. |
| 7,218,127 B2 | 5/2007 | Cooper et al. |
| 7,218,131 B2 | 5/2007 | Tanioka et al. |
| 7,265,565 B2 | 9/2007 | Chen et al. |
| 7,274,195 B2 | 9/2007 | Takemoto et al. |
| 7,285,966 B2 | 10/2007 | Lee et al. |
| 7,436,192 B2 | 10/2008 | Kister |
| 7,511,523 B2 | 3/2009 | Chen et al. |
| 2002/0070743 A1 | 6/2002 | Felici et al. |
| 2002/0153913 A1 | 10/2002 | Okubo et al. |
| 2004/0104737 A1 | 6/2004 | Haga et al. |
| 2004/0119485 A1 | 6/2004 | Koch et al. |
| 2004/0239352 A1 | 12/2004 | Mizoguchi |
| 2005/0179458 A1 | 8/2005 | Chen et al. |
| 2005/0189955 A1 | 9/2005 | Takemoto et al. |
| 2006/0073712 A1 * | 4/2006 | Suhir .......................... 439/74 |
| 2006/0082380 A1 | 4/2006 | Tanioka et al. |
| 2006/0170440 A1 | 8/2006 | Sudin |
| 2006/0171425 A1 | 8/2006 | Lee et al. |
| 2007/0167022 A1 | 7/2007 | Tsai et al. |

FOREIGN PATENT DOCUMENTS

| | | |
|---|---|---|
| JP | 11241690 | 9/1999 |
| WO | WO 8704568 | 7/1987 |
| WO | WO 96/15458 | 5/1996 |

* cited by examiner

KNEE PROBE HAVING REDUCED THICKNESS SECTION FOR CONTROL OF SCRUB MOTION

CROSS REFERENCE TO RELATED APPLICATIONS

This application claims the benefit of U.S. patent application Ser. No. 11/450,977, filed on Jun. 9, 2006, entitled "Knee Probe having Increased Scrub Motion". Application Ser. No. 11/450,977 claims the benefit of U.S. patent application Ser. No. 10/850,921, filed on May 21, 2004, entitled "Freely Deflecting Knee Probe with Controlled Scrub Motion".

FIELD OF THE INVENTION

The present invention relates to probes for testing electronic circuitry. Particularly, the present invention relates to vertical probes having a rigid columnar structure and a suspension knee for controlled scrub motion.

This invention relates to electrical probes for automated circuit and device testing.

In the field of electronic circuitry testing, scrubbing and contact force is an important factor in establishing a low resistance electrical contact between a probe tip and the test contact. During scrubbing, an eventual insulating oxide layer is removed in the interface between the contact tip and the test contact. Scrubbing is a microscopic shear movement of the probe tip along the test contact surface while a certain pressure is exerted from the probe tip onto the test contact. As size and pitch of test contacts decrease, it becomes increasingly difficult to tune the scrub motion irrespective of friction influences in the tip/contact interface. Also, as the IC manufacturers incorporate designs with I.C. pads and bumps placed over chip's active circuitry it becomes important that the scrub of the probe does not cause damage to the underlying circuitry. The size of the window of acceptable probe operation therefore, is restrained from one side by the contact resistance requirements calling for a sizable scrub, smaller scrub size required by smaller targets that need to be probed as pitches decrease, and smaller scrub (including depth) to avoid damage to the underlying circuitry.

The new generation of I.C. chips has pads that are placed over active circuitry in order to maximize use of the real estate. These types of chips are commonly referred in the industry as chips with "low-K dielectric". The low-K dielectric refers to the fragile polymer-based insulator now placed between the pads and the underlying circuits for electrical purposes. It is not acceptable to damage the low-K dielectric during probing operations either.

In the prior art, well known buckling beam probes have been utilized to provide a combined resilient deflection and scrubbing. In order for a buckling beam probe to operate properly with a well defined scrub motion it needs to be rigidly held on its peripheral shaft and additionally guided close to the contact tip. This makes the buckling beam probe's assembly increasingly challenging with ever decreasing scale. Therefore, there exists a need for a probe that may be easily assembled in large numbers and small scale while providing a well definable scrub motion. The present invention addresses this need.

The contact resistance issue has also been addressed by probes having separate parts for scrubbing and for making electrical contact. For example, US 2004/0239352 considers dual probes having a contact probe and a separate scrub probe, where the scrub probe moves in such a way as to clean the part of the contact pad that will end up under the contact probe during test. In some cases (e.g., copper deposition manufacturing), circuit fabrication processes provide contact pads which are covered with a protective dielectric film (e.g., a silicon dioxide film). U.S. Pat. No. 6,727,719 considers a probe having an inner contact needle and an outer hard layer, where the hard outer layer is adapted for penetrating such a protective film.

An important consequence of decreasing probe and contact pad dimensions is that the current density at the probe-pad contact increases. This increased current density also raises issues which have not come up before in connection with large probes on large pads. More specifically, the current density can be high enough to form micro-welds between the probe and the pad due to local heating. Breaking these micro-welds as the probe is removed from the contact pad can lead to degradation of the probe tip (e.g., by accumulation of non-conductive material), thereby reducing probe reliability and/or lifetime.

BACKGROUND

Testing of electrical devices and circuits has been an important component of electronic manufacturing processes for some time. Such testing typically entails probing a circuit with a fixture including multiple flexible probes, each probe making electrical contact to a contact pad on the circuit chip. Various practical issues that have arisen in this context have been addressed in the prior art, especially in connection with providing reliable, low-resistance electrical contact.

It is well known that electrical contact between the probe and the contact pad can be hampered by the presence of non-conductive material on the pad and/or the probe (e.g., a thin oxide film). Accordingly, considerable attention has been devoted to details of how the tip of the probe moves relative to the contact pad in order to improve the resulting electrical connection. This relative motion is usually referred to as a scrub motion. For example, U.S. Pat. No. 5,923,178 considers a probe having a shape which provides a scrub motion which is primarily a rocking motion without appreciable sliding. U.S. Pat. No. 5,952,843 considers a probe having a canted tip portion to facilitate penetration of the passivation layer. U.S. Pat. No. 6,529,021 considers a probe arrangement where the probe tip can be made to move in a reciprocating manner to reduce contact resistance.

As circuit manufacturing technology continues to evolve to smaller critical dimensions, new practical issues relating to probing tend to arise which are not fully addressed by prior art approaches. For example, the decreasing size of contact pads as critical dimensions are reduced leads to increasingly demanding requirements on the ability to precisely control the probe scrub motion. Excessive scrub motion can cause loss of electrical contact, if the probe moves off the contact pad.

Accordingly, it would be an advance in the art to provide greater control of probe scrub motion.

SUMMARY

A preferably vertically assembled probe features a substantially rigid columnar structure and a connected suspension knee. The probe is held in assembly via its columnar structure. The suspension knee has a base arm laterally connecting at and propagating away from a connect end of the columnar structure. The base arm extends up to a lateral knee extension where a reverse arm continues from the base arm back in direction towards a central axis of the columnar structure. The reverse arm terminates in a contact tip in a tip offset to the column axis that is smaller than the lateral knee extension. During application of a contacting force onto the contact tip, a first deflection of the base arm and a second deflection of the reverse arm counter act in conjunction with base and reverse arms structural configuration. As a result, scrub motion may be well defined in direction and magnitude without need for additional guidance of the deflecting probe structure.

The entire probe is preferably symmetric with respect to a symmetry plane through the column axis and a tip axis, which is central with respect to a contacting face of the contact tip. The probe has preferably a continuous profile in direction normal to the symmetry plane fabricated for example by electroplating. Base and reverse arms are preferably linearly protruding with a knee bent in between, which results in combination with continuous probe profile in a scrub motion highly in plane with the symmetry plane.

The probes may be arrayed with tight pitch that is less than the total width of the probe. Adjacent suspension knees may overlap while leaving sufficient clearance. The probes may be assembled via their columnar structures for example in a sandwiching fixture and clamping plates that provide a shearing clamping of the columnar structures. The probes may be also simultaneously fabricated in a probe comb including a number of probes linearly arrayed with final assembly pitch and held together by a bridge connecting to each of the arrayed probes on the peripheral end of the columnar structure. The bridge may be removed after a number of probe combs are stacked and fixed with respect to each other. Improved probing is provided using a knee probe where the knee curves away from the probe axis and then curves back to connect to the probe tip, crossing the probe axis on the way to the tip. The resulting lateral offset between the probe tip and the probe axis is a key geometrical parameter for predetermining the scrub motion provided by the probe in response to a predetermined contact force. The scrub motion preferably includes both a sliding motion and a rocking motion, where the sliding motion acts to clean the contact pad and the rocking motion acts to bring a clean part of the probe tip into contact with the freshly cleaned part of the contact pad. In preferred embodiments, the probe tip can include one or more relatively narrow "skates" for making contact to the contact pad. A dual skate configuration is especially appropriate when small dimples are at the centers of the contact pads.

Embodiments of the invention provide numerous advantages. The use of a probe having an "overshoot" knee as described above and in more detail below generally tends to increase the scrub motion compared to knee probes which do not "overshoot" the probe axis. In preferred embodiments, the invention makes use of multilayer probes, which facilitates the fabrication of probes having narrow "skates" on the probe tips. Such skates advantageously decouple the contact width (which should be small to increase contact for per unit area) from the probe width (which should be large enough to prevent motion in directions other than in the intended deflection plane). Multi-layer probes also allow the skate layers to be made of a suitable tip contact material, while the remaining layers are not constrained to be suitable tip contact materials. Dual-skate probe tips can be employed to probe contact pads having dimples at their centers (e.g., as provided by plating techniques for forming contact pads). In this case, the skates advantageously avoid the dimple, thereby avoiding issues relating to degraded electrical contact and increased mechanical stress on the probe tip that can arise when probing is performed directly at dimple locations.

To better appreciate the present invention, it is helpful to consider some aspects of prior work by the present inventor. In particular, U.S. patent application Ser. No. 11/450,977 by the present inventor considers a knee probe where the knee curves away from the probe axis and then curves back to connect to the probe tip, crossing the probe axis on the way to the tip. This configuration can be described as having a negative tip offset, in contrast to probes having no tip offset (i.e., the probe tip is aligned with the probe axis), or probes having a positive tip offset (i.e., the knee section does not cross the probe axis). Other parameters being comparable, probes having negative tip offset tend to provide longer scrub marks than probes having zero or positive tip offset. In some cases, it is desirable to decrease the scrub length provided by a probe having negative tip offset.

Such reduction in scrub length can be provided according to the present invention by modifying the probe shape. More specifically, the probe knee section includes a reduced thickness section to alter the mechanical behavior of the probe when contact is made. Providing a reduced thickness section of the probe makes it easier to deflect the probe vertically when contact is made. This increased ease of vertical deflection tends to reduce the horizontal contact force component responsible for the scrub motion, thereby decreasing scrub length. Here "thickness" is the probe thickness in the deflection plane of the probe (i.e., the plane in which the probe knee lies).

The reduced thickness section of the probe can be described in terms of a probe thickness function $h(z)$, where $z$ is distance along the probe, having a local minimum. A probe having uniform thickness would have a constant $h(z)$, and a tapered probe would have a monotonically decreasing $h(z)$. In either of these two conventional cases, $h(z)$ would not have a local minimum.

Although reduction of scrub length for negative tip offset probes is one application of the invention, the invention is also applicable to probes having no tip offset and to positive tip offset probes. In general, embodiments of the invention can provide improved control of scrub motion (e.g., by varying details of the reduced thickness section such as location, amount of thickness reduction, etc.), especially in combination with other probe parameters affecting scrub motion.

DETAILED DESCRIPTION

Figure 1:
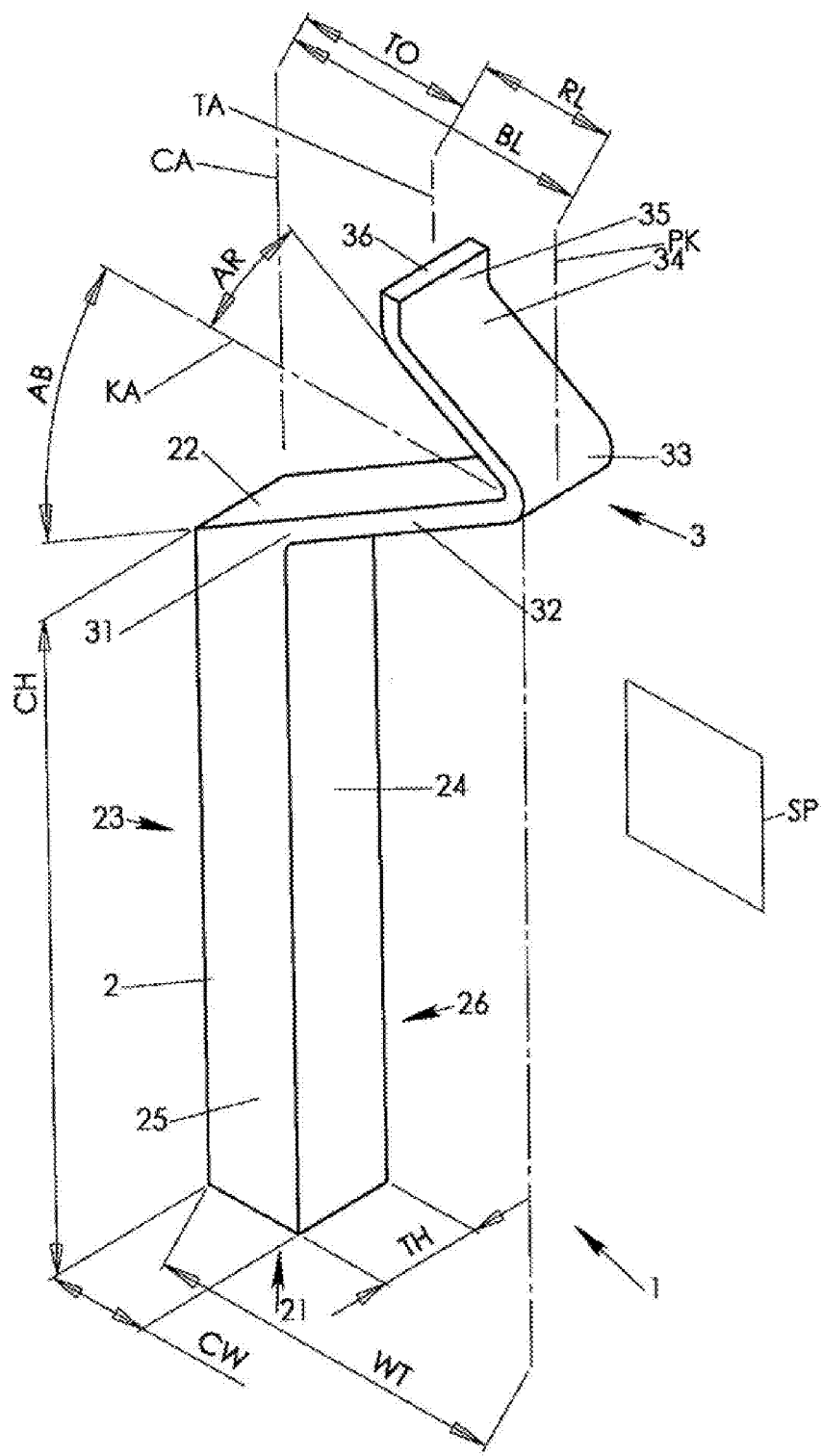
FIG. 1 is a first perspective view of an exemplary probe in accordance with a preferred embodiment of the invention.

Referring to FIG. 1, a probe 1 in accordance with a preferred embodiment of the invention features a rigid columnar structure 2 having a peripheral end 21, a connect end 22, a knee opposing face 23, a connect face 24, a front face 25 and a back face 26. The columnar structure 2 is preferably symmetric with respect to a central column axis CA. At the connect end 22, a suspension knee 3 is laterally connecting via its base arm 32, which propagates away from the column axis CA substantially up to a lateral knee extension PK. A reverse arm 34 continues from the base arm 32. The reverse arm 34 propagates away from the lateral knee extension PK in direction towards the column axis CA with a reverse length RL. At the end of the reverse arm 34 is a contacting tip 35. The contacting tip 35 has a contacting face 36 with a tip axis TA central with respect to the contacting face 36. The tip axis TA is offset from the column axis CA in a tip offset TO. The tip offset TO is smaller than the lateral knee extension PK such that during application of a contacting force preferably along the tip axis TA a first deflection of the base arm 32 and a second deflection of the reverse arm 34 counteract, resulting in a predetermined scrub motion of the contacting tip 35, The suspension knee 3 is connected to the rigid columnar structure 2 via a suspension connect 31.

The probe 1 is preferably symmetric with respect to a symmetry plane SP that coincides with the column axis CA and the tip axis TA. As a preferred result, the scrub motion is substantially in plane with the symmetry plane SP. The probe 1 may have a continuous profile in direction perpendicular with respect to the symmetry plane SP such that the columnar structure 2 as well as the elements of the suspension knee 3 have substantially rectangular cross sections.

The columnar structure 2 has a first pair of adjacent faces and a second pair of adjacent faces, the first pair opposing the second pair. A first pair may be for example faces 24, 26 and a second pair may be faces 23, 25. The probe 1 may be fabricated in a layered fabrication technique such as well known electroplating in combination with negative shaped mask. Relevant dimensions of the probe 1 include probe thickness TH, total probe width WT, column width CW, column height CH, tip offset TO, lateral knee extension BL and reverse arm length RL. In the preferred case of substantially linearly protruding base arm 32 and/or reverse arm 34, relevant dimensions include also a base arm angle AB and reverse arm angle AR between a knee axis KA and their respective arms 32, 34. The knee axis KA is a geometric element coinciding with a center of a knee bent 33 referencing the orientation of the knee bent 33 with respect to the column axis CA. The knee axis may be utilized to characterize the displacement behavior of the suspension knee 3 as depicted in the spectral displacement plots of FIGS. 10, 12, 14, 16, 17, 19.

In the FIGS. 1-8, the arms 32, 34 as well as the knee bent 33 and contacting tip 35 are depicted as having constant cross sections. Nevertheless, arms 32, 34, knee bent 33 and contacting tip 35 may have tuned configurations to provide a scrub motion predetermined in direction and magnitude in response to a contacting force exerted onto the contacting face 36 during operational contacting of the probe 1 with a test contact as is well known in the art. Such tuned configurations and their influence on the scrub motion are described in more detail under FIGS. 9-18.

Figure 2:
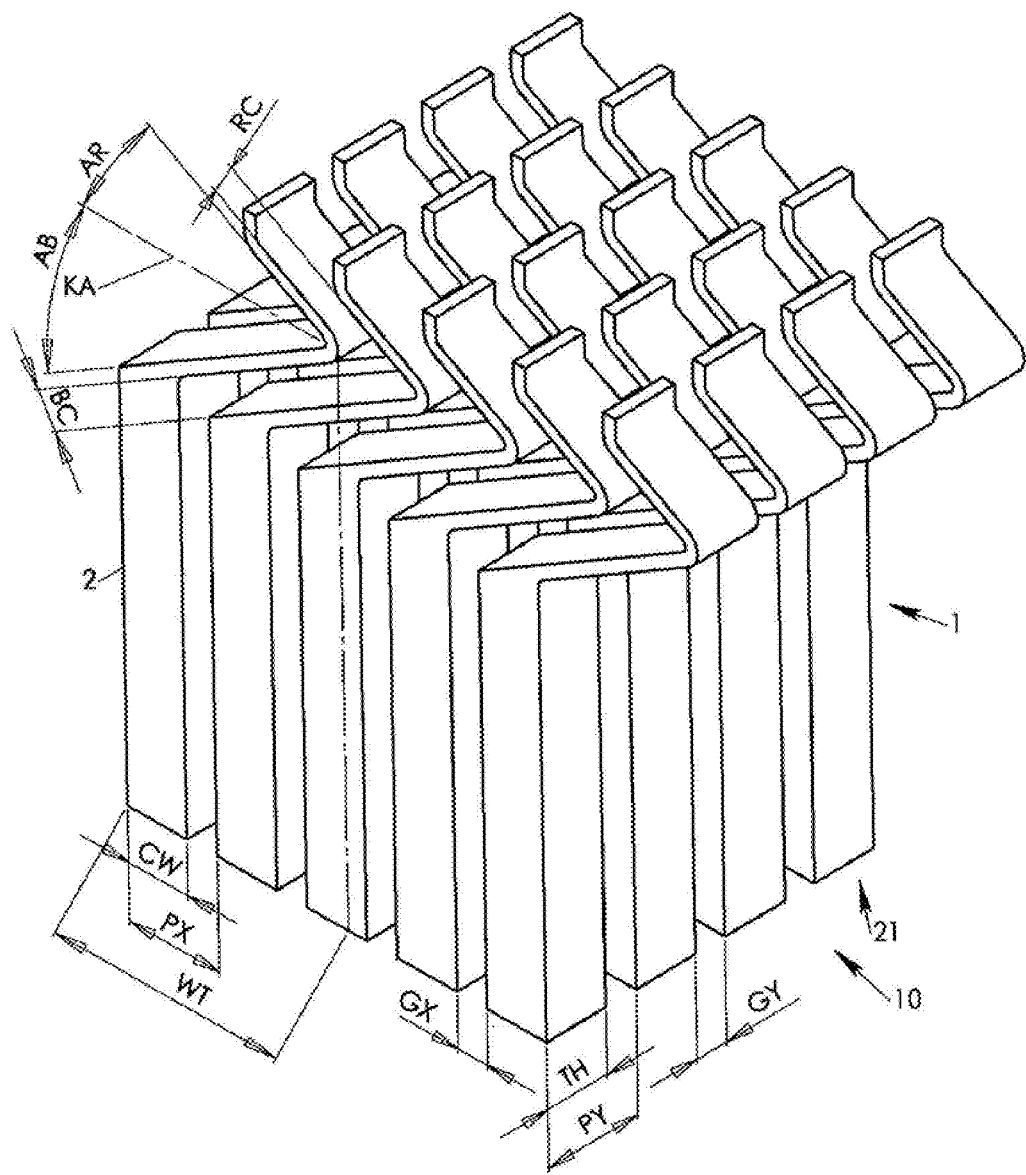
FIG. 2 is the first perspective view of a number of probes of FIG. 1 in exemplary assembly array.
Figure 3:
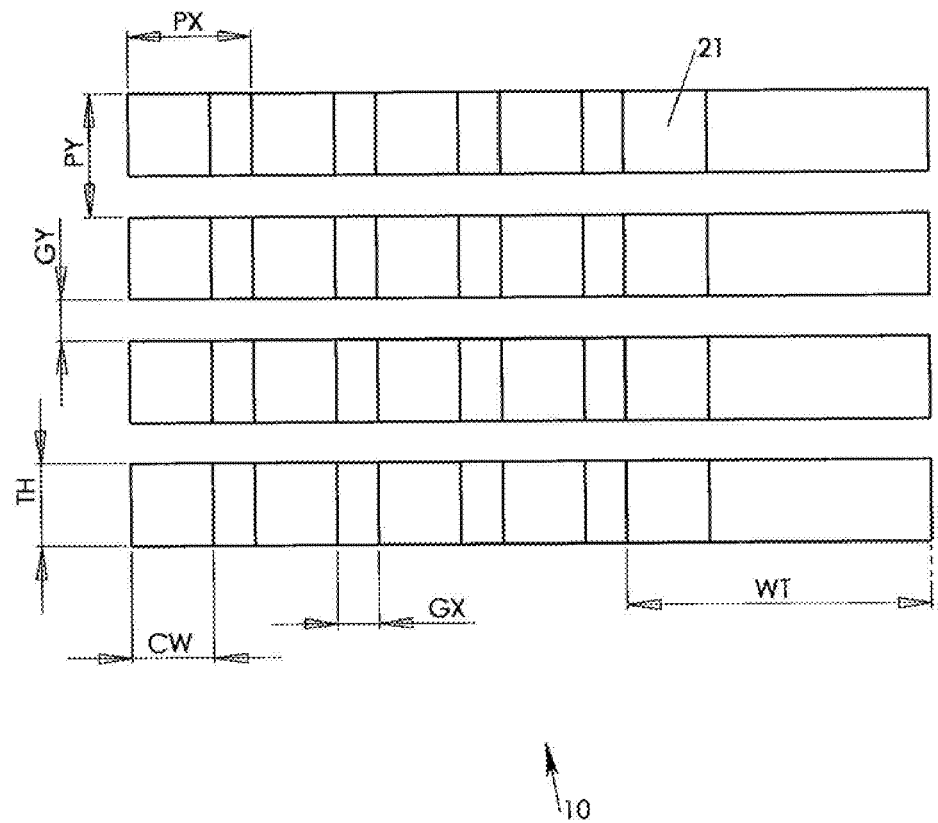
FIG. 3 is a top view of the probe array of FIG. 2.

Referring to FIGS. 2, 3, multiple representations of probe 1 may be arrayed with a first pitch PX that is substantially smaller than the total width WT. Base and reverse angles AB, AR are selected such that for a given first pitch PX sufficient base arm clearance BC and reverse arm clearance RC is established for an unimpeded deflection of each suspension knee 3 within the array. The first pitch PX may be selected in conjunction with the column width CW such that a first gap GX remains at a minimum required for an assembly for the arrayed probes 1.

Multiple representations of probe 1 may be arrayed in a two dimensional probe array 10 with the first pitch PX in a preferred direction parallel to the probes' 1 knee axes KA and a second pitch PY preferably perpendicular to the first pitch PX. The second pitch PY may be selected in conjunction with the probe thickness TH such that a second gap GY remains at a minimum required for an assembly for the arrayed probes 1. Providing the probes 1 in a configuration for a sole assembly via their rigid columnar structures 2 and for a scrub motion predetermined in direction and magnitude is highly advantageous for a tight interlaced array of the probes 1. For example, probes 1 having a probe thickness TH of about 2 mils, a total width WT of about 8 mils and a column width CW of about 2 mils may be assembled with a first pitch PX of about 4 mils and a second pitch of about 3 mils.

Referring to FIGS. 4-7, the probes 1 may be fixedly held in a probe assembly 100 including fixture plates 4 that may be combined and/or part of a well known probe apparatus for testing electronic circuitry. Each fixture plate 4 has a number of fixing cutouts 41 with a contour larger than the rectangular cross section of the columnar structure 2. Each fixing cutout 41 has two fixing faces 411, 412 that correspond to the first pair of adjacent feces 24, 25. The probe assembly further includes a clamping plate 5 having a number of clamping cutouts 51 also with a contour larger than the rectangular cross section of the columnar structure 2. Each clamping cutout 51 has two clamping faces 511, 512 that correspond to the second pair of adjacent faces 23, 26. Fixing cutouts 41 and clamping cutouts 51 are fabricated into their respective plates 4, 5 with pitches PX and PY.

Figure 4:
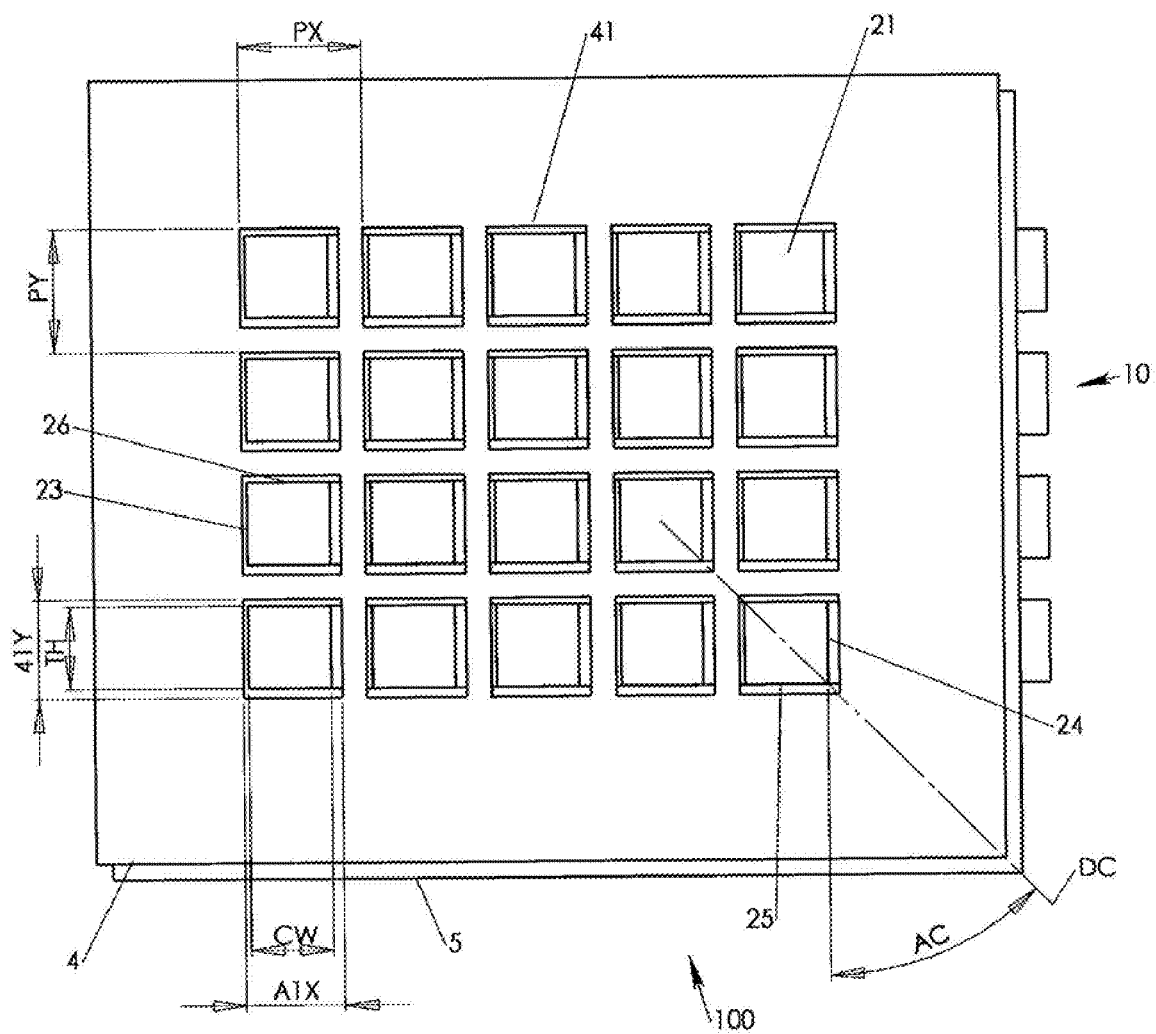
FIG. 4 is the top view of the probe array of FIG. 2 together with sandwiched fixture and clamping plate in aligned cutout position for probe insertion.
Figure 5:
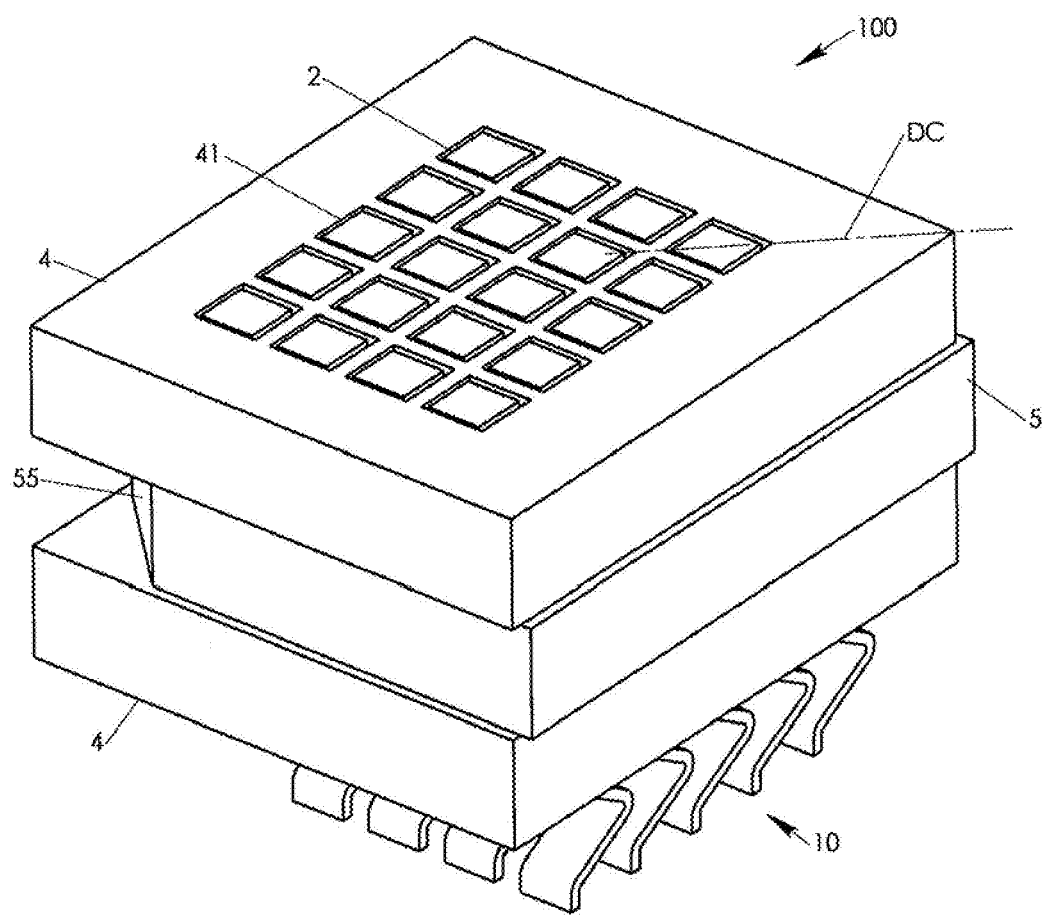
FIG. 5 is a second perspective view of the assembly of FIG. 4.
Figure 6:
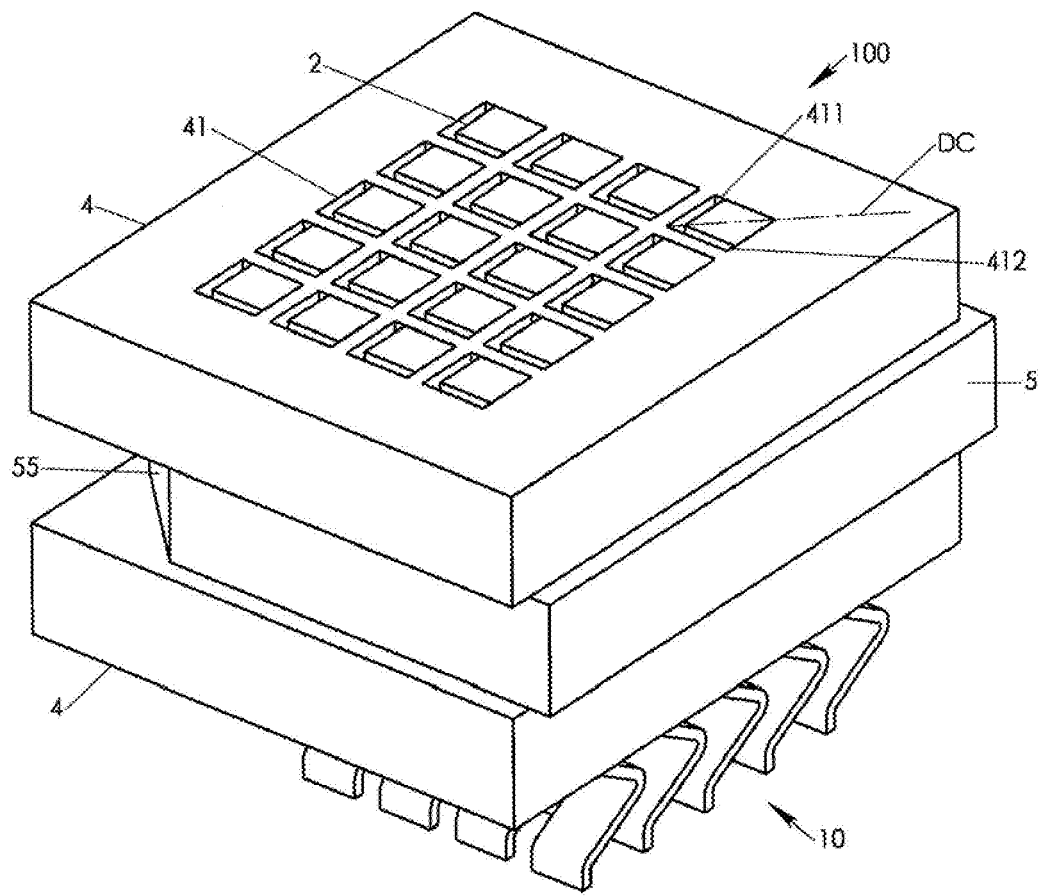
FIG. 6 is the second perspective view of the assembly of FIG. 5 in shear clamp configuration.
Figure 7:
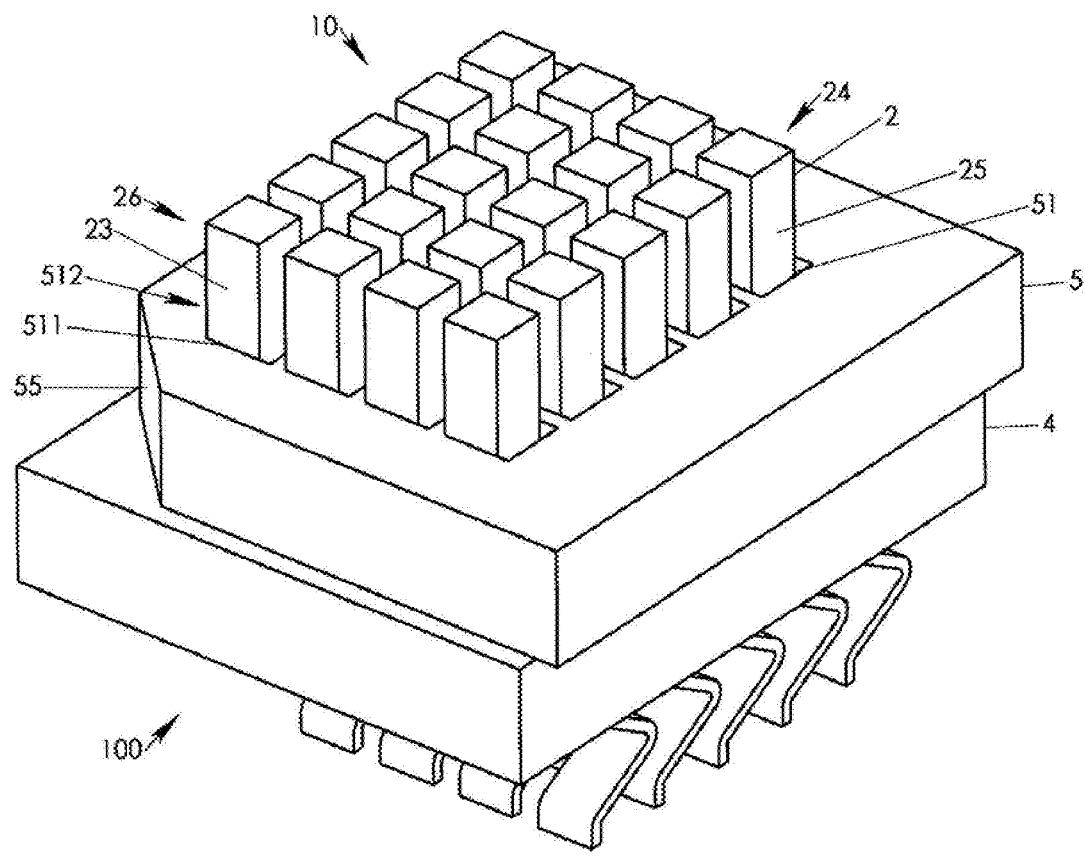
FIG. 7 is the second perspective view of the assembly of FIG. 6 with the top fixture plate being removed for illustration purpose.

The clamping plate may be held with respect to the fixture plates 4 in an assembly position as seen in FIGS. 4, 5 and a clamping position as seen in FIGS. 6, 7. In the assembly position, the clamping cutouts 51 align with the fixing cutouts 41 such that a columnar structure 2 may be inserted in the fixing cutouts 41 and the clamping cutouts 51. In the clamping position, the clamping plate 51 is offset in a clamp direction DC relative to its assembly position. The clamp direction DC is in a clamp angle AC which preferably corresponds approximately with a diagonal between the enclosed edges of the first pair of adjacent faces 24, 25 and the second pair of adjacent faces 23, 26. As a result of the angled clamping offset, the first pair of adjacent faces 24, 25 is forced into snuggle contact with the fixing faces 411, 412 and the second pair of adjacent faces 23, 26 is forced into snuggle contact with the clamping faces 511, 512 such that each probe is fixedly held in a predetermined pitch and orientation with respect to the fixture plates 4 and with respect to each other.

Plates 4, 5 may be fabricated from ceramic with the cutouts 41, 51 being deep trench etched as may be well appreciated by anyone skilled in the art. The clamping plate 5 may be forced into the clamping offset via any well known mechanical feature such as a screw pressing against a clamping access feature 55. The clamping direction DC is self adjusting as long as the clamping force is applied in direction approximately complying with the predetermined clamping direction DC as may be well appreciated by anyone skilled in the art. The clamping plate 5 may be actuated without particular guides. Assembly position stoppers may be provided for the clamping plate to warrant alignment of the clamping cutouts 51 with the fixing cutouts 41 in assembly position. Positioning of the probes 1 in direction along the column height CH may be provided via an auxiliary stop plate (not shown) temporarily placed adjacent opposite an insertion side of the plate assembly such that the peripheral ends 21 contact the stop plate once fully inserted into the cutouts 41, 51. After clamping, the stop plate may be removed. The probes 1 may be bonded in clamped position by an epoxy or other well known techniques. The cutouts 41, 51 may also be configured as conductively coated via holes conductively connected to peripheral terminals on the plates 41, and/or 51. The probes 1 may also be conductively accessed via well known wire bonding techniques bonding wires to the peripheral ends 21 as may be well appreciated by anyone skilled in the art. The fully fabricated probe assembly 100 may be inserted and/or assembled in a well known probe apparatus.

Figure 8:
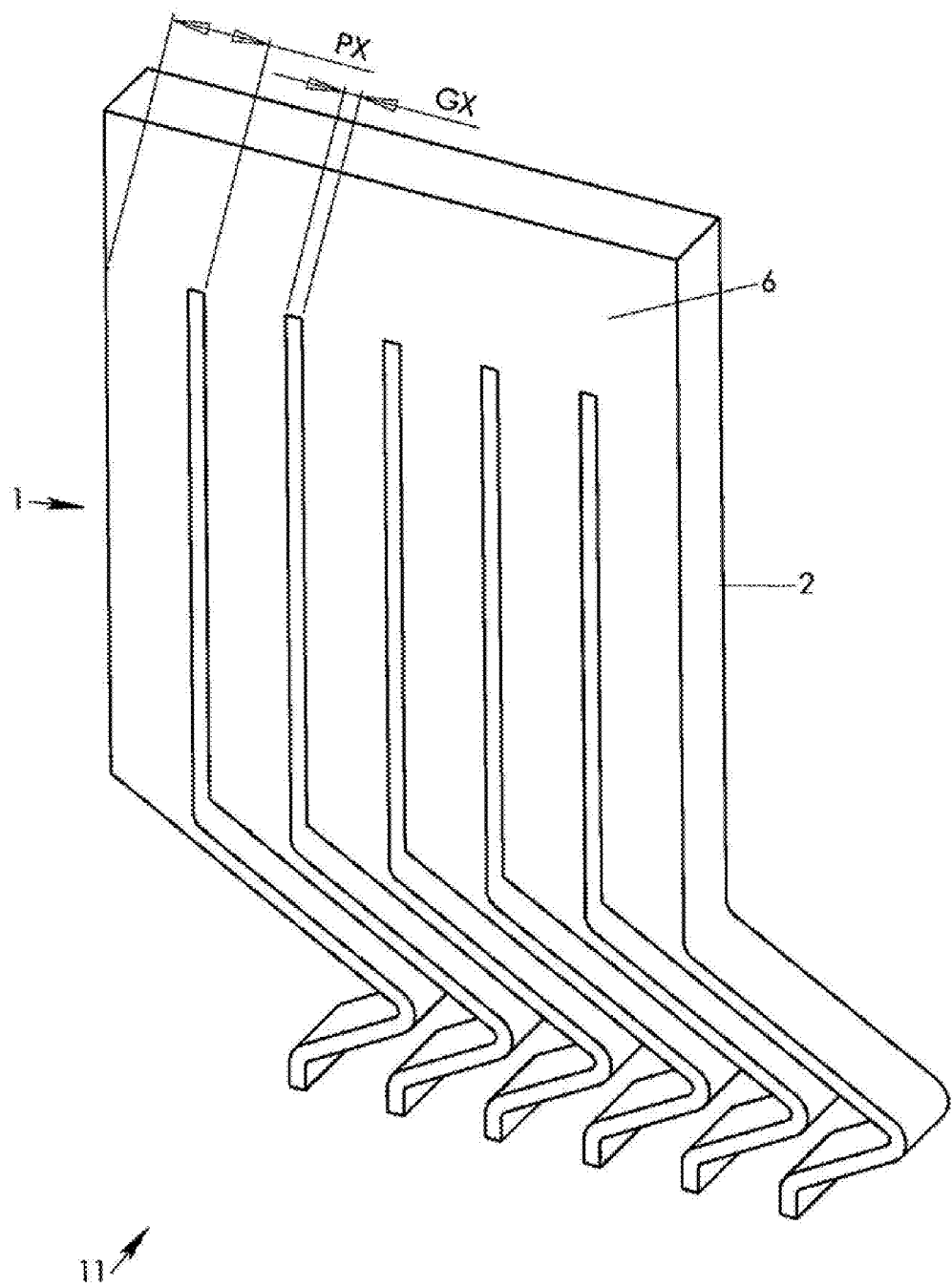
FIG. 8 is a third perspective view of an exemplary probe comb of a number of linearly arrayed probes combined by a bridge.

To facilitate the assembly of large numbers of probes 1, a number of probes 1 may be simultaneously fabricated as a probe comb 11 as is exemplarily illustrated in FIG. 8. The probe comb 11 is held together by a probe bridge 6 connected to each of the arrayed probes' 1 peripheral end 21. A number of probe combs 11 may be stacked with second pitch PY in protrusion direction of the probe comb 11, forming large two dimensional probe arrays. Individual probe combs 11 may be spaced apart by spacers that provide second gaps GY. The probe combs 11 may be held in alignment along second pitch PY direction by surrounding frame structures and/or by form features on both sides of the spacers. The form features may fit into the gaps GX. The probe combs 11 may alternately be assembled by inserting them with there probe bridges 6 in correspondingly shaped grooves of a template plate (not shown).

After the probe combs 11 are positioning with respect to each other, they may be fixed by use of a resin filled into the gaps between the probes 1. After curing of the resin, the probe bridges 6 may be removed and the individual probes 1 conductively accessed as described above.

Figure 9:
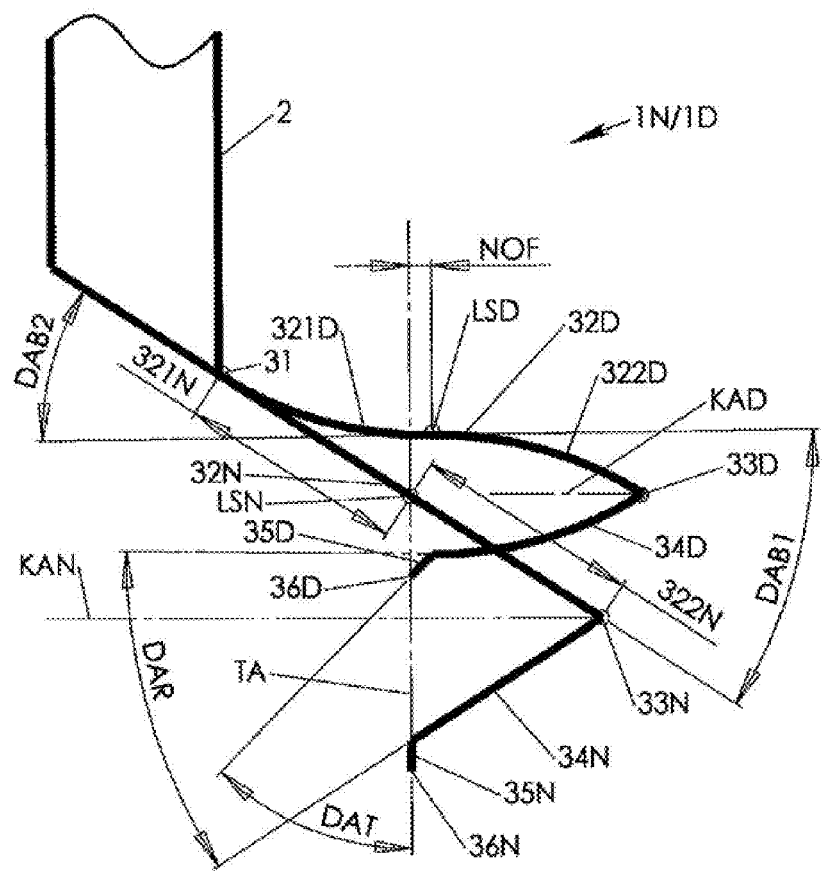
FIG. 9 is a schematic front view of a suspension knee in deflected and non deflected condition.
Figure 10:
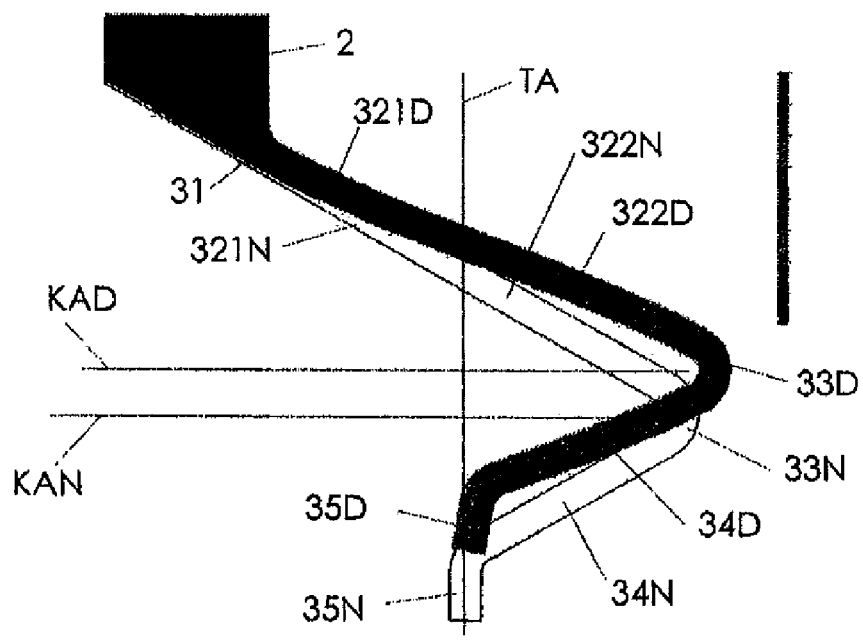
FIGS. 10, 12, 14, 16, 17, 19 are colored front views of spectral displacement plots of variously configured suspension knees.
Figure 11:
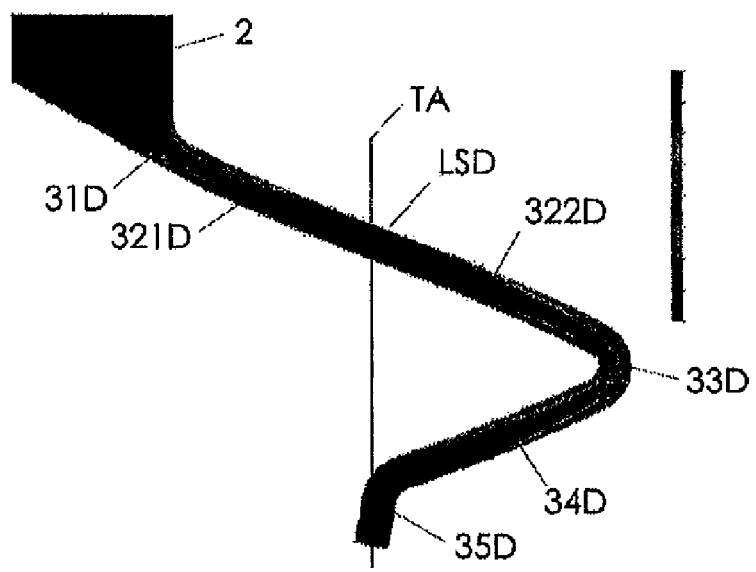
FIG. 11 is a colored front view of a spectral stress plot of the suspension knee of FIG. 10.

Suspension connect 31, base arm 32, knee bent 33, reverse arm 34, and contacting tip 35 may have various tuned configurations resulting in varying scrub motions. Referring to FIGS. 9-3 a first tuned configuration is described in which a lateral scrub motion with respect to the tip axis TA is substantially zero. In FIGS. 9-19, numerals pertaining to the deflected elements of the suspension knee 3 have a suffix letter D, whereas numerals pertaining to non deflected elements of the suspension knee 3 have a suffix letter N. A contacting force resulting from the operative approach of the contacting tip 35 on a test contact 210 (see FIGS. 20, 21) may act upon the contacting face 36N/36D along the tip axis TA. Where the tip axis TA crosses the base arm 32N/32D, the base arm 32N/32D has its local bending stresses at a minimum as can be seen in the spectral stress plots of FIGS. 11, 13 and 15, 18. At these low stress regions LS, LSN/LSD, the central base arm portion 321D has its maximum angular central base arm deflection DAB1 with respect to the central base arm portion's 321N natural orientation and the peripheral base arm portion 322D has its maximum angular peripheral base arm deflection DAB2 with respect to the peripheral base arm portion's 322N natural orientation. This is, because a first bending momentum acting on the central base arm portion 321N/321D is opposing a second bending momentum acting on the peripheral base arm portion 322N/322D. According to FIG. 9, the first bending momentum and the second bending momentum act counter clock wise or generally speaking in direction away from the upper portion of the column axis CA. The first bending momentum hinges thereby on the suspension connect 31 and the second bending momentum hinges on the knee bent 33.

A third bending momentum acts on the reverse arm 34N/34D hinging on the knee bent 33 generally in direction opposite the second bending momentum. According to FIGS. 10, 11, the third bending momentum acts clock wise. First, second and third bending momentums result from the contacting force as may be well appreciated by anyone skilled in the art. The third bending momentum results in a maximum angular reverse arm deflection DAR with respect to the reverse arm's 34N natural orientation.

The first tuned configuration includes dimensional and structural configurations of suspension connect 31, central base arm portion 321, peripheral base arm portion 322, knee bent 33 and reverse arm 34 such that maximum local angular deflections DAB1, DAB2 and OAR are substantially equal. An indication for the first tuned configuration is that the natural knee axis KAN of the non deflected suspension knee 3 is substantially parallel to the deflected knee axis KAD of the operationally deflected suspension knee 3.

During deflection of the central base arm portion 321N/321D a lateral offset NOF may be introduced to the remainder of the suspension knee 3 due to the geometric conditions and geometric relations of the deflected and non deflected central base arm portion 321N/321D as may be well appreciated by anyone skilled in the art. The contacting tip 35 may be configured in length and deflection behavior such that the lateral offset NOF may be substantially compensated for. At the contacting face 36D, the contacting tip 35D may consequently have a maximum angular tip deflection DAT contributing to the scrub motion. Hence, in the first tuned configuration, the scrub motion includes substantially only angular movement of the contacting face 36.

Figure 12:
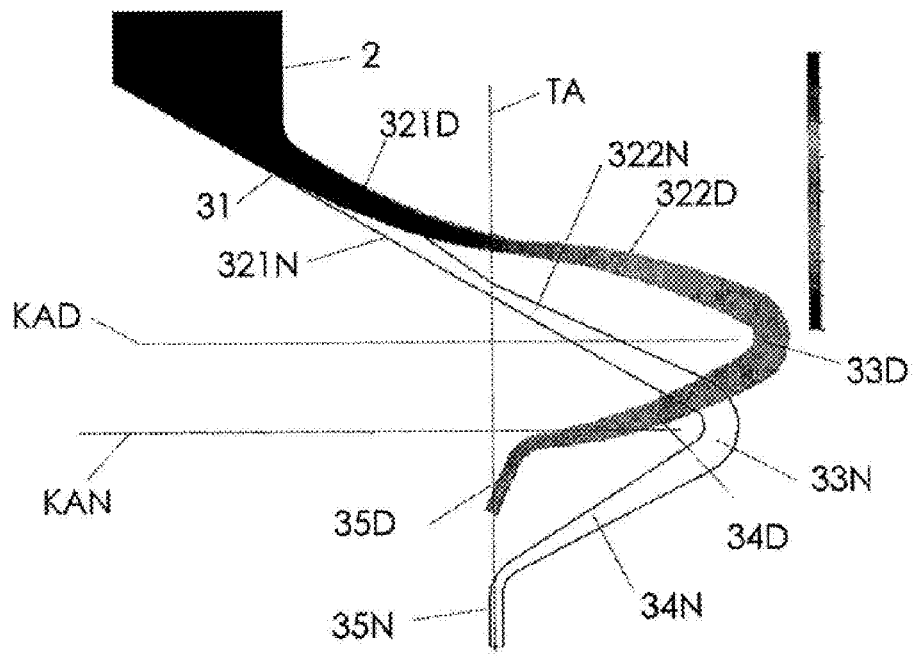
Figure 13:
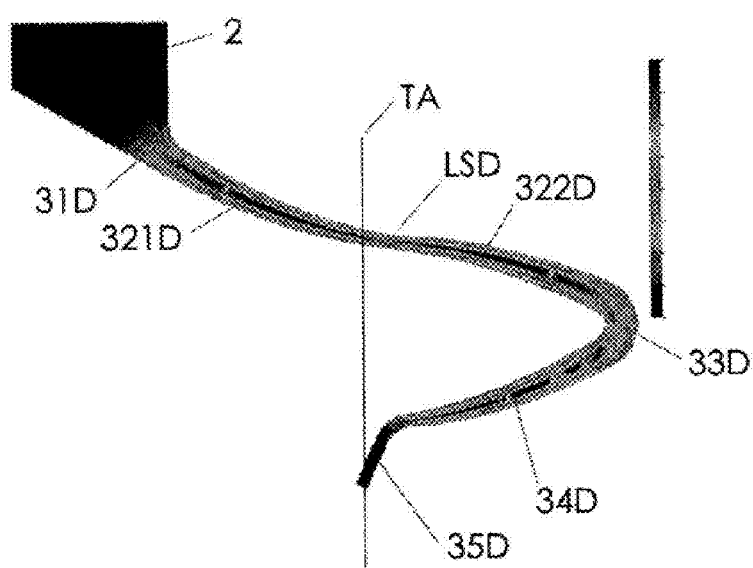
FIG. 13 is a colored front view of a spectral stress plot of the suspension knee of FIG. 12.

For a required contacting force, the operational deflection of the suspension knee 3 may be adjusted by configuring the elements of the suspension knee 3 for a leveled stress maxima as can be seen in the FIGS. 12, 13. There, the cross sections are adjusted with continuous thickness TH such that stress maxima propagate highly continuous along suspension connect 31, central and peripheral base arm portions 321, 322, knee bent 33, reverse arm 34 and contacting tip 35. Optimizing the suspension knee 3 with constant thickness TH is particularly preferred in combination with continuous profile of probe 1 and fabrication techniques layered in profile direction such as well known electroplating in combination with a negative mask corresponding to the contour of the probe's 1 continuous profile. Nevertheless, the suspension knee 3 may also be optimized by varying the thickness TH as may be well appreciated by anyone skilled in the art.

Figure 14:
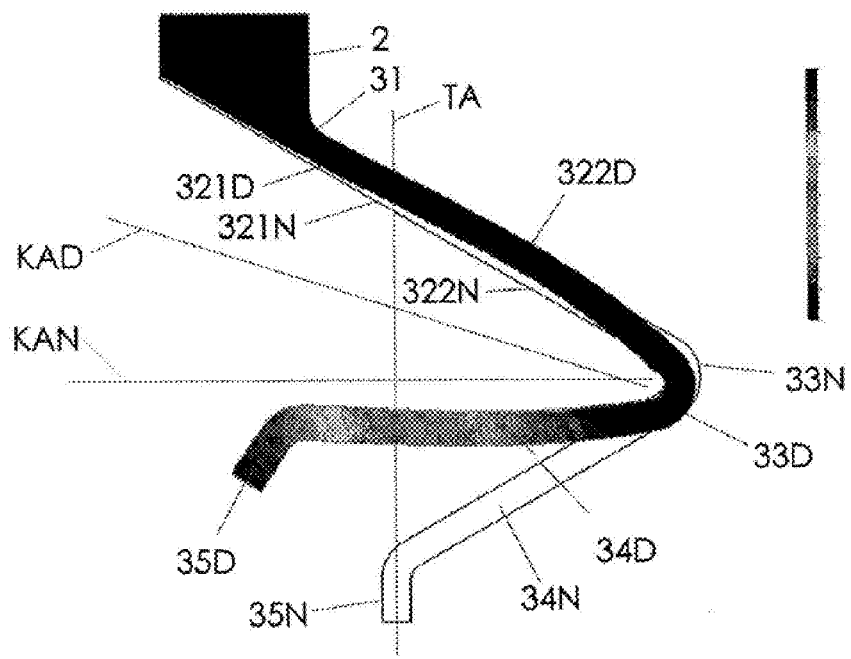
Figure 15:
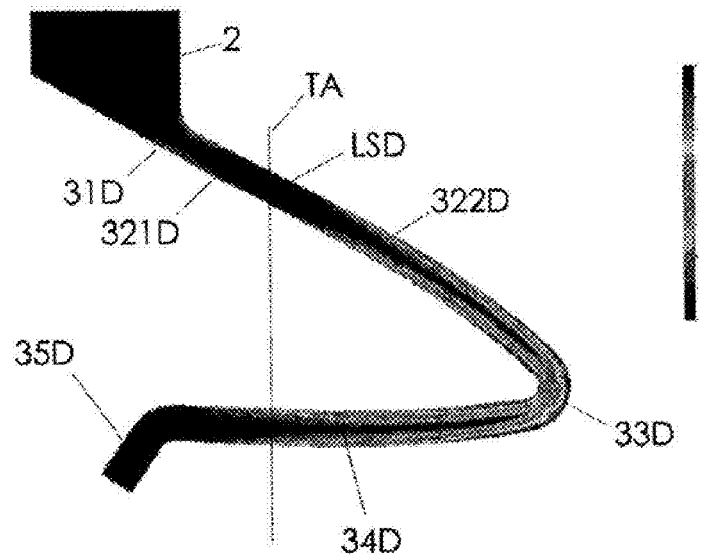
FIG. 15 is a colored front view of a spectral stress plot of the suspension knee of FIG. 14.
Figure 16:
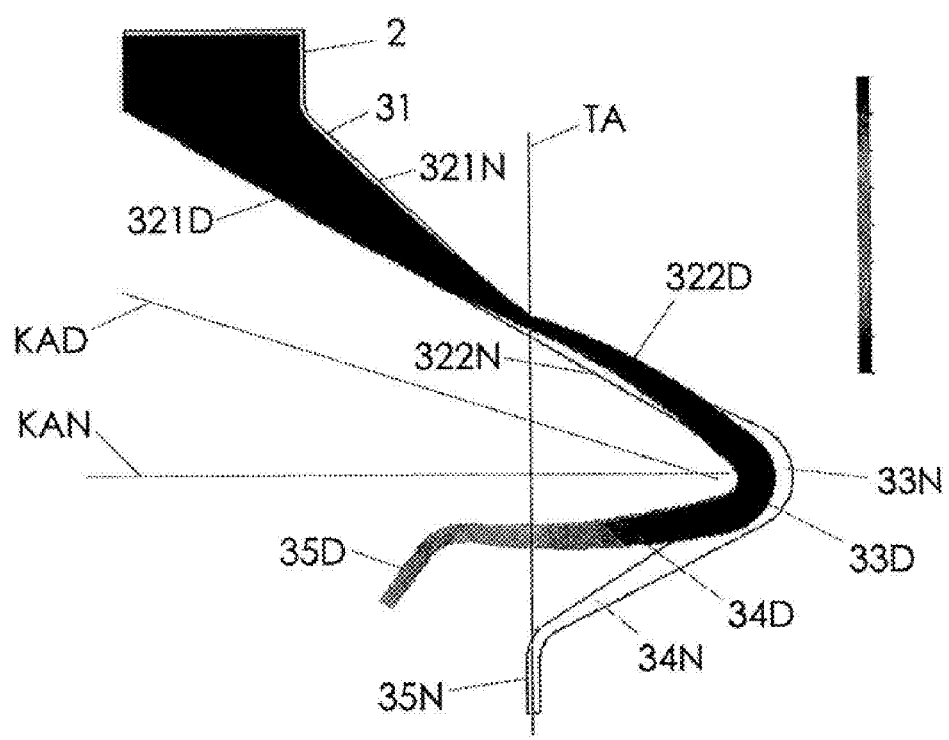

Referring to FIGS. 14-16, a second tuned configuration of the suspension knee 3 provides a scrub motion in direction towards the column axis CA. According to FIGS. 14 and 15, the second tuned configuration may be provided for a continuously shaped base arm 32 by extending the reverse arm 34 such that the tip axis TA divides the base arm into a central base arm portion 321 that is shorter than the peripheral base arm portion 322. Consequently, the maximum angular deflection DAB1 of central arm portion 321D is smaller than the maximum angular deflection DAB2 of the peripheral arm portion 322D. Since base arm 32 and reverse arm 34 have substantially equal and continuous cross sections, DAB2 is equal DAR. The summary of DAB1, DAB2 and DAR results generally in a tilt of the displaced knee axis KAD in direction away from the upper portion of the column axis CA. With respect to FIGS. 14 and 16, the displaced knee axis KAD is tilted in clockwise direction with respect to the natural non deflected knee axis KAN. The resulting lateral scrub motion is in direction towards the central axis CA. FIG. 15 depicts the corresponding stresses.

The same condition of DAB1 being smaller than DAB2 with DAB2 being equal DAR is depicted in FIG. 16. There, the central base arm portion 321 is configured with larger bending stiffness than the peripheral base arm portion 322. Even though the tip axis TA is at a distance to CA equal to the above described first tuned condition of FIGS. 9-13, the dissimilar structural configuration of both base arm portions 321, 322 is the prevailing condition determining the direction and magnitude of the scrub motion.

Figure 17:
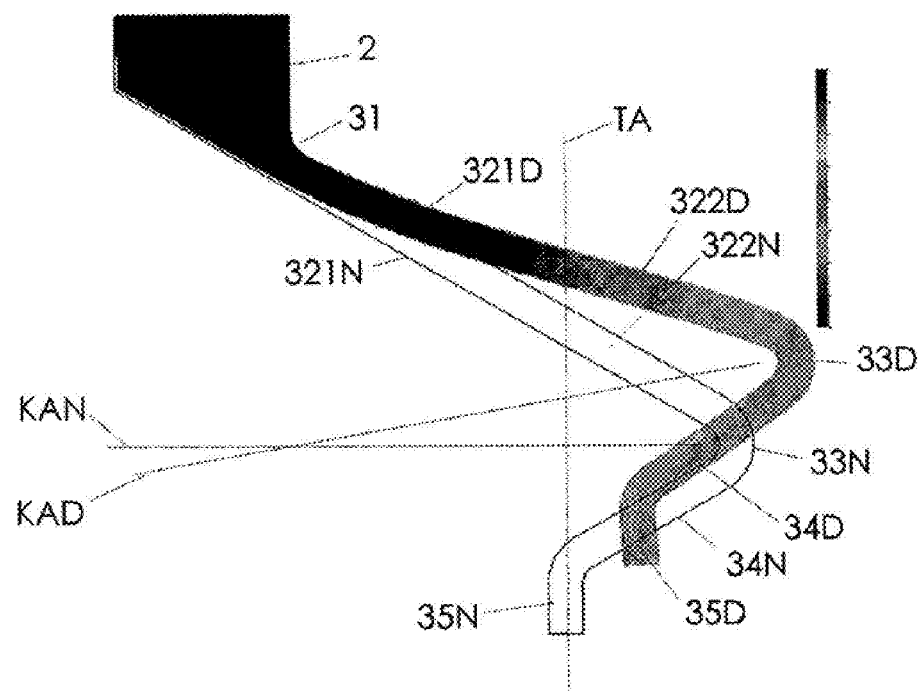
Figure 18:
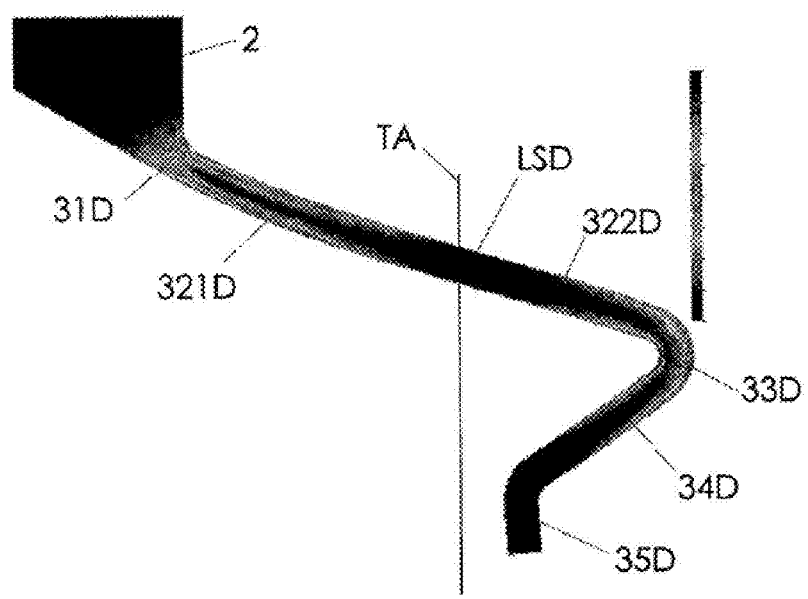
FIG. 18 is a colored front view of a spectral stress plot of the suspension knee of FIG. 17.

The teachings of FIGS. 14-18 may be inverted to obtain a third tuned configuration in which the scrub motion is in direction away from the central axis CA as may be well appreciated by anyone skilled in the art. Accordingly and as shown in FIGS. 17, 18, the suspension knee 3 is configured with the tip axis TA dividing the base arm 32 in a central base arm portion 321 that is longer than the peripheral base arm portion 322. Despite continuous cross sections of base arm 32 and reverse arm 34, DAB1 being larger than DAB2 results in a scrub motion away from the central axis CA irrespective of DAB2 being equal DAR, which is illustrated in FIG. 17 by the deflected knee axis KAD being rotated in counter clockwise direction with respect to the natural knee axis KAN or generally speaking, in the third tuned configuration the deflected knee axis KAD is rotated with respect to the natural knee axis KAN in direction towards the upper portion of the column axis CA.

Figure 19:
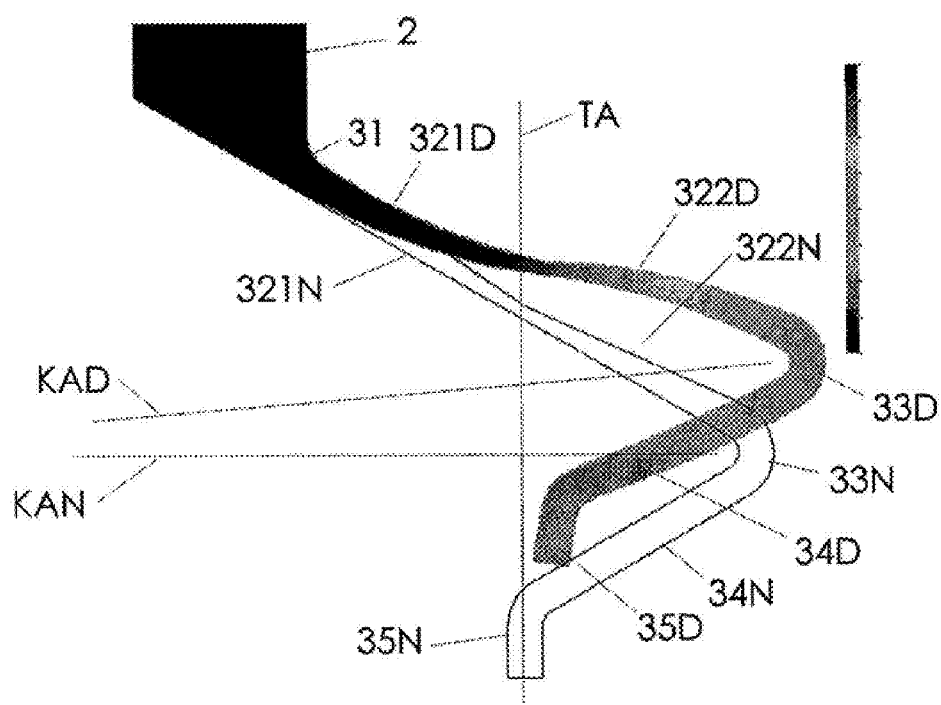

Second or third tuned configuration may be obtained also by adjusting the reverse arm's 34 deflection behavior in conjunction with the peripheral base arm portion's 322 deflection behavior as illustrated in FIG. 19. There, the base arm portions 321, 322 are configured with equal deflection behavior such that DAB1 equals DAB2. The reverse arm 34 on the other hand is stiffer than the peripheral arm portion 322 resulting in DAR being smaller than DAB2 and consequently a third tuned configuration with a linear scrub motion away from the central axis CA. In case, the reverse arm 34 would be less stiff than the peripheral base arm portion 322, the second tuned configuration would be established with the linear scrub motion towards the central axis CA.

As may be well appreciated by anyone skilled in the art, the teachings presented under the FIGS. 9-19 may be well applied to configure various shapes of the suspension knee's 3 elements. Further more, the contacting force represented in the Figures by the tip axis TA may be adjusted in angle with respect to the column axis CA. Consequently, for a given geometry of the suspension knee 3, first, second or third tuned configuration may be provided by assembling the probe 1 with its column axis CA in predetermined angle with respect to the contacting force defined by the probe apparatus in conjunction with the test contact 210 (see FIGS. 20, 21) as may be well appreciated by anyone skilled in the art. For example, the probe 1 may be provided with a first tuned configuration in case of the tip axis TA being parallel to the column axis CA. Tilting such probe 1 in direction towards its knee 33 may result in a second tuned configuration whereas a tilting of such probe 1 in direction away from its knee 33 may result in a third tuned configuration. Tilting the probe 1 may be a convenient technique of fine tuning the linear scrub motion in direction and magnitude without need to remanufacture the probe 1.

Figure 20:
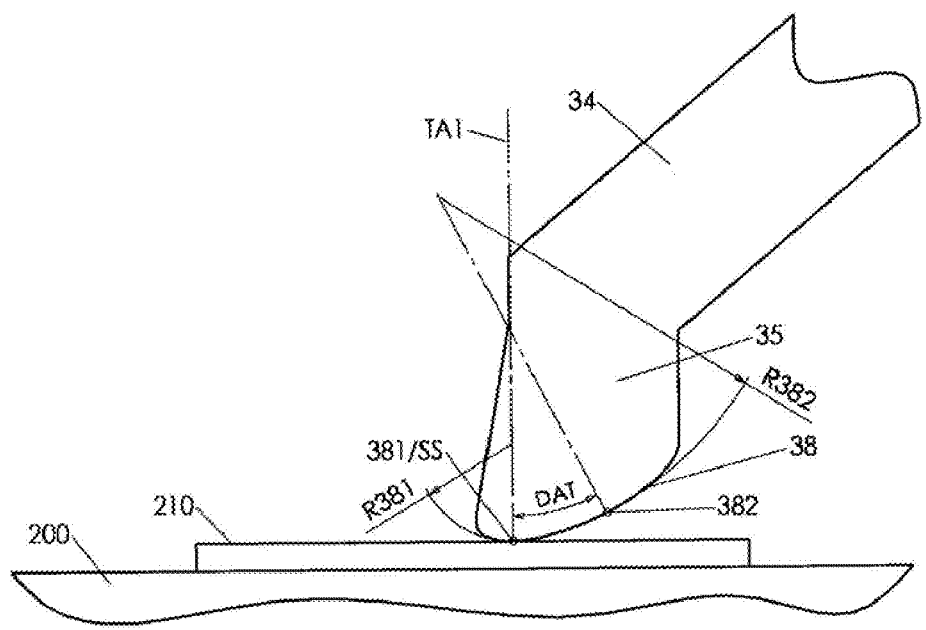
FIG. 20 is a front view of a multiradius contacting tip in initial contact with a test contact.
Figure 21:
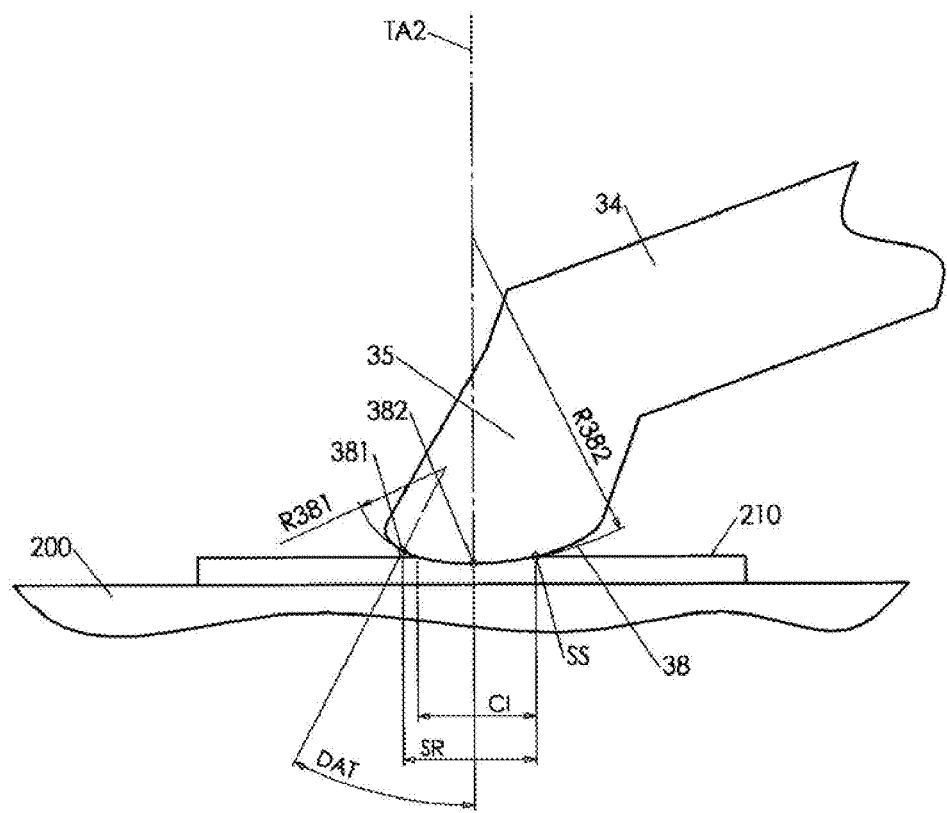
FIG. 21 is the front view with the multiradius contacting tip of FIG. 20 in operational contact with the test contact of FIG. 20.

As taught under FIGS. 9-19, scrub motion may be adjusted for its lateral movement component in direction and, magnitude and for its angular movement component in magnitude as may be well appreciated by anyone skilled in the art, The advantageous combination of angular and lateral scrub motion adjustability may be combined with a multiradius contacting face 38 as illustrated in FIGS. 20, 21. The multiradius contacting face 38 may have at least a first contacting radius R381 at the initial contacting region 381 where the multiradius face 38 initially contacts the test contact 210 of a tested electronic device 210. An initial tip axis TA1 may origin in the initial contacting region 381.

As the probe 1 is brought into operational deflection with respect to the test contact 210, the multiradius face 38 may be rotated with maximum tip deflection angle DAT such that an operational contacting region 382 comes into contact with the test contact 210. An operational tip axis TA2 may origin from the central interface between operational contacting region 382 and the test contact 210. Between initial contacting at scrub start location SS and operational contacting, the multiradius face 38 prescribes a lateral scrub SL and an angular scrub equal DAT. Orientation of TA1 and TA2 may be affected by friction in the tip/contact interface CI as may be well appreciated by anyone skilled in the art.

The operational contacting region 382 has second contacting radius R382 substantially larger than first contacting radius R381. The multiradius face 38 hence features at least two radius R381, R382 that contribute to a smooth and continuously curvature of the multiradius face 38. The two radius R381, R382 may be selected in conjunction with the change of contacting force as a function of angular tip displacement such that contacting pressure in the tip/contact interface CI remains within a predetermined limit.

Figure 22:
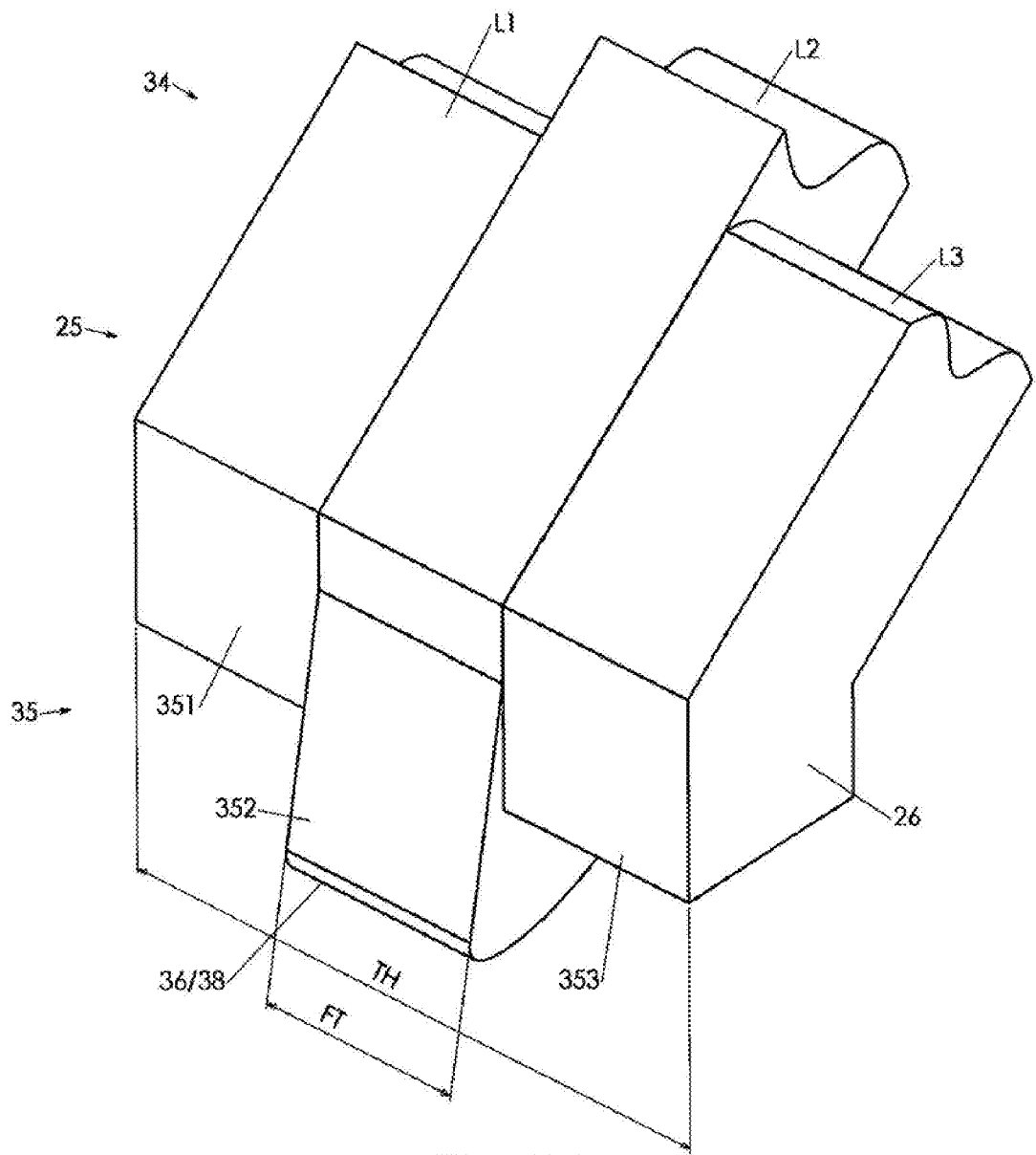
FIG. 22 is a fourth perspective view of a contacting tip with three tip segments.

Referring to FIG. 22, area of and pressure in the tip/contact interface CI may also be adjusted by varying the contacting face thickness FT to levels less than the probe thickness TH. Also, the contacting tip 35 may be split into tip segments 351, 352, 353 of which one or more may provide contacting face(s) 36 or 38. For that purpose, the probe 1 may be fabricated from a number of layers L1, L2, L3 deposited in multiple steps for example by electroplating in combination with multiple masks as may be well appreciated by anyone skilled in the art. The layers L1, L2, L3 may partially and/or fully extend across the probe's 1 profile contour and may be made of materials suitable for their particular task. For example, the layer L2 illustrated in FIG. 22 with the contacting face 36 may be fabricated from a material specifically suitable for probe tips such as rhodium. A single contacting face 36 or 38 may be placed centrally as shown in FIG. 22. Alternatively, dual contacting faces 36 or 38 may be provided by tip segments 351, 353, one adjacent the front face 25 and the other adjacent the back face 26. This may also assist in stabilizing the suspension knee's 3 deflection behavior within the symmetry plane SP and to reduce the risk of inadvertent lateral scrub motion deviations.

The contacting tips 351, 352, 353 may be arranged in a tripod like fashion with each contacting segment having a contacting face 36 or 38 for providing a self centering contacting on a test contact in the well known spherical configuration. The suspension knee 3 may be layered in direction along the symmetry plane SP. The layer configuration may also be adjusted in view of low surface resistance for high frequency current flow from the contacting tip 36 or 38 to the peripheral end 21 or the column 2. Tip segments 351, 352 and 353 may also be fabricated from same material resulting in a monolithic structure. The spectral plots of FIGS. 10-19 are generated with a commercially available FEA software.

Figures 23A, 23B:
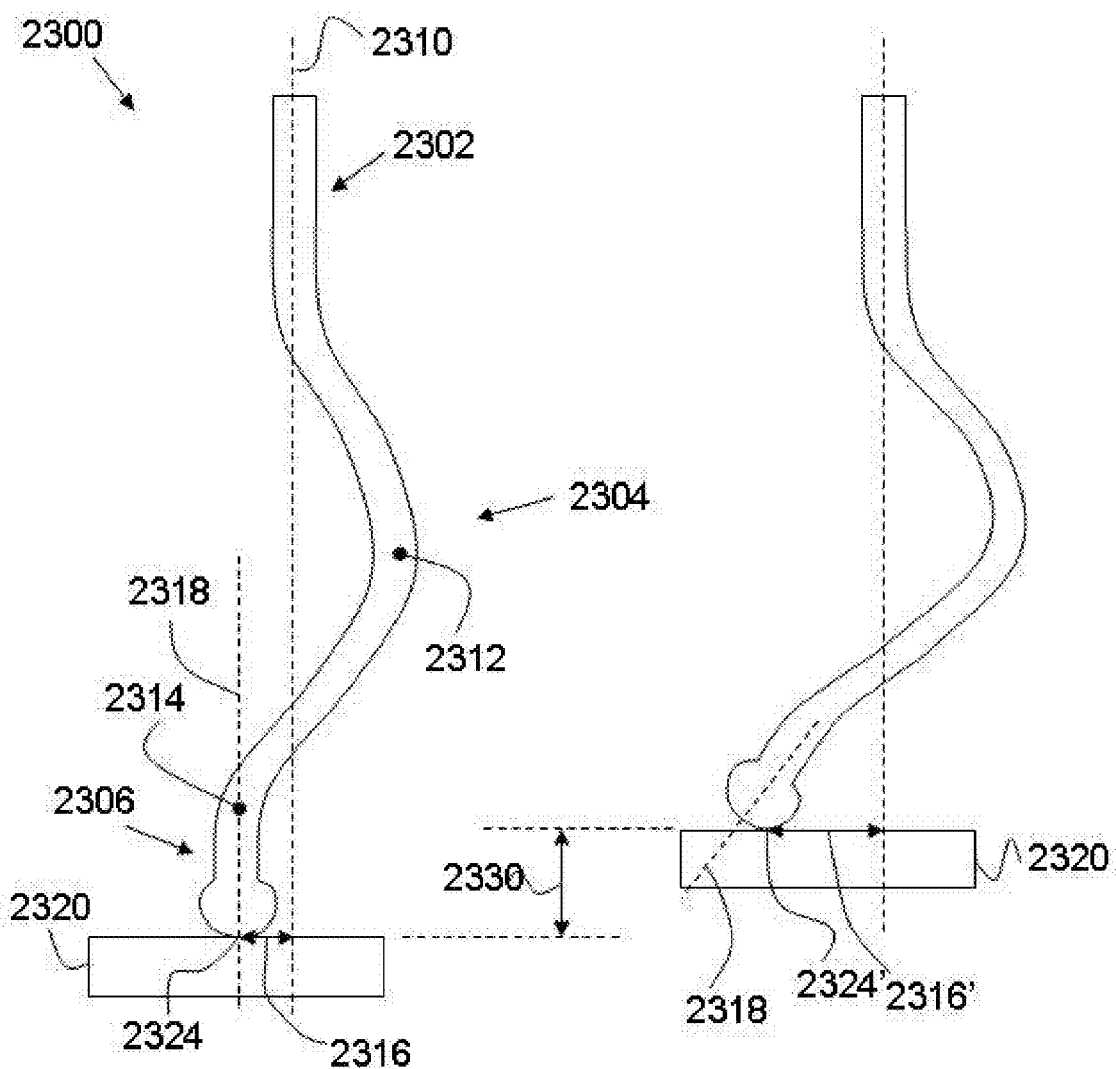
FIG. 23a shows a first contact probe configuration according to an embodiment of the invention.
FIG. 23b shows an operational probe configuration according to an embodiment of the invention.

FIG. 23a shows a "first contact" probe configuration according to an embodiment of the invention, and FIG. 23b shows a corresponding operational probe configuration. Here "first contact" refers to the situation where a probe is in contact with a contact pad, but no contact force is applied. In contrast, an operational probe configuration makes contact with the contact pad with a predetermined contact force. Since the probe deforms in response to the contact force, the shape of the probe differs in the two cases. In particular, how the probe moves from the first contact configuration to the operational configuration is a key aspect of the invention.

A probe 2300 includes a shank 2302, a knee section 2304 and a probe tip 2306 as parts of a single structure, as shown. Shank 2302 is straight and does not deflect appreciably during contact, so it is convenient to regard shank 2302 as defining a probe axis 2310 with which it is aligned. Knee section 2304 extends from shank 2302 to probe tip 2306, and includes two parts. A first part of knee section 2304 starts at shank 2302 and extends outward from probe axis 2310 to reach a knee point 2312. Knee point 2312 is a point of maximum separation from probe axis 2310. A second part of knee section 2304 starts at knee point 2312 and extends to a tip location 2314, such that probe axis 2310 is between knee point 2312 and tip location 2314. A lateral tip offset 2316 is thereby defined between the probe tip and the probe axis. Probe tip 2306 is in contact with a contact pad 2320 defining a contact point 2324.

Thus knee section 2304 can be regarded as extending outward for a certain distance D (the first part) and then curving back for a distance greater than D (the second part), thereby establishing the lateral offset 2316. The present inventor has found that this probe configuration can provide improved probing performance. For comparison, U.S. patent application Ser. No.10/850,921 by the present inventor considers a knee probe having a knee which curves back by a distance less than D (i.e., it does not overshoot the probe axis).

FIG. 23b shows the corresponding operational probe configuration for the example of FIG. 23a. Here contact pad 2320 is moved toward probe shank 2302 by a vertical displacement 2330. Equivalently, a predetermined contact force is applied to the probe shank. For any particular probe design, there is a one to one relation (i.e., this relation is a mathematical function, which can be linear or nonlinear) between vertical displacement and contact force, as is well known in the art, so both ways of describing the operational configuration are employed interchangeably in the following description. Probe 2300 deforms under the contact force, and FIG. 23b shows key parameters of this deformation. More specifically, contact point 2324' on FIG. 23b is farther from probe axis 2310 than the corresponding contact point 2324 on FIG. 23a. Thus the probe tip slides along the contact pad for a certain distance (i.e., the difference between 2316' and 2316 on FIGS. 23a-b). In addition to this sliding motion, the probe tip also "rocks" relative to the contact pad. This rocking motion can be more clearly appreciated by defining a "tip axis" 2318 on FIG. 23a which is required to be parallel to probe axis 2310 and which passes through the contact point 2324. In the operational configuration of FIG. 23b, tip axis 2318 is no longer parallel to probe axis 2310. The angle between tip axis 2318 and probe axis 2310 on FIG. 23b is a measure of the amount of rocking motion provided.

Thus the scrub motion provided in this example includes both a sliding motion of the probe tip relative to the contact pad, and a rocking motion of the probe tip relative to the contact pad. A key aspect of the invention is that parameters of the scrub motion (e.g., slide length and rocking angle) can be predetermined, in part, by geometrical parameters of the probe and by the predetermined contact force (or equivalently, predetermined vertical displacement). More explicitly, a probing method according to the invention includes: providing a probe having the general configuration of FIG. 23a (i.e., having a knee section with an overshoot), making contact between the probe tip and a device under test, and applying a predetermined contact force to the probe shank, thereby providing a predetermined scrub motion of the probe tip on the contact pad. The scrub motion is predetermined in part by the contact force and by geometrical parameters of the probe.

The friction provided by the contact pad is also a relevant factor for determining the scrub motion, so probe designs and/or methods will typically need to account for variations in contact pad friction. The speed with which contact is made has also been found to be relevant. More specifically, the sliding motion length on the contact pad (also referred to as scrub length) tends to decrease as the relative contact velocity between probe tip and contact pad increases. Another method of further controlling the scrub length is by laterally moving the probe as contact is made. Lateral probe motion in the direction of the tip offset will increase the scrub length, and lateral probe motion in the opposite direction will decrease the scrub length. Such lateral probe motion can be provided by appropriate motion control of a chuck holding the probe (or probes), or by appropriate motion control of a stage holding the device under test. Further scrub length control can be provided by controlling relative velocity and/or lateral probe motion. Scrub length can be measured after probing has occurred by measuring the length of the mark left by the probe on the contact pad. Such measurements are important for verifying proper probe performance.

A scrub motion including both a sliding motion and a rocking motion has provided improved results in practice. Investigations indicate that the sliding motion acts to scrape non-conductive material from the contact pad to create an exposed area of the contact pad, and the rocking motion acts to bring a clean part of the probe tip into contact with the freshly exposed area of the contact pad. From FIGS. 23a-b, it is apparent that the rocking motion causes a different point of the probe tip to be in contact with the contact pad in the operational configuration than in the "first contact" configuration. Providing a scrub motion including both of these motions is therefore preferred.

Suitable materials for probe 2300 and probe tip 2306 are well known in the art, and any such materials can be employed in practicing the invention. Suitable tip materials are electrically conductive and wear-resistant, and include Rh and Cr.

Detailed design work in accordance with the above-identified principles of the invention has led to a point design as well as identification of some preferred parameter ranges. A point design for making contact to Cu or Al contact pads (or flat topped columns) has a tip offset (2316 on FIG. 23a) of 0.18 mm, a knee offset (distance between knee point 2312 and probe axis 2310 on FIG. 23a) of 0.31 mm, and a probe length (combined length of probe tip and knee section in Z direction on FIG. 23a) of 1.95 mm. In this point design, the probe width is 0.076 mm, and the probe material is Nickel-Cobalt alloy. The tip offset is preferably in a range from about 0.05 mm to about 0.25 mm. The knee offset is preferably in a range from about 0.05 mm to about 0.5 mm. The probe length is preferably between about 0.5 mm and about 3.0 mm.

For a configuration with a small knee offset and large tip offset one can expect a longer scrub length. For a configuration with large knee offset and small tip offset, a shorter scrub length is expected. Large contact friction requires a probe design that generates larger horizontal reaction force typically produced with larger scrub length. Smoother, less frictional contact pad surfaces require a probe design producing a shorter scrub length.

As indicated above, for any particular probe, there is a predetermined relation between contact force and vertical deflection. As the probe stiffness increases, the amount of contact force required for a given vertical deflection increases. A typical vertical deflection in practice is 75 μm (i.e. about 3 mils), and for this amount of deflection, the contact force is preferably between about 0.025 N and about 0.15 N (i.e., about 2.5 to 15 grams force), and is more preferably between about 0.08 N and about 0.10 N (i.e., about 8 to 10 grams force). The vertical deflection during contact is preferably between about 12 μm and about 125 μm and is more preferably between about 50 μm and about 75 μm.

Figure 29:
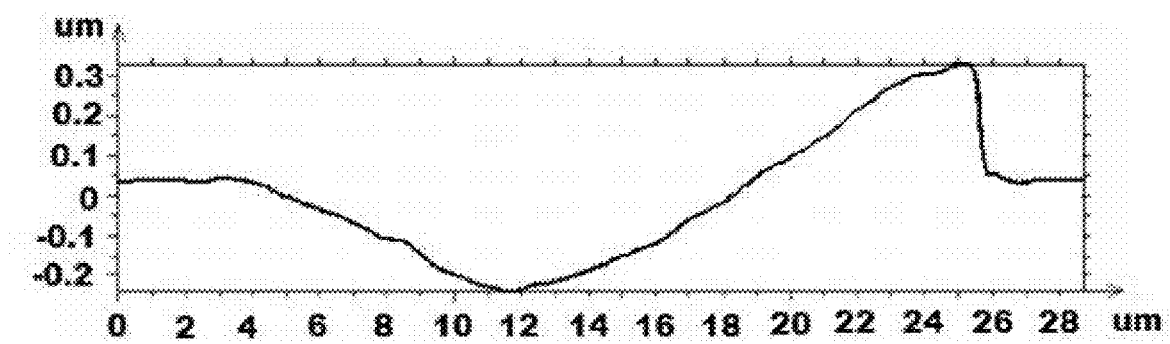
FIG. 29 shows a depth profile for a scrub mark made in accordance with an embodiment of the invention.

Another way to describe probing according to the invention is in terms of parameters of the scrub mark left on the contact pad by the probe. The scrub mark width is preferably between about 3.0 μm and about 15.0 μm and is more preferably about 7 μm wide. The scrub mark depth is preferably between about 0.1 μm and about 2.0 μm and is more preferably about 0.6 μm. FIG. 29 shows an example of a measured scrub mark depth profile. The scrub mark length is preferably between about 3.0 μm and about 44.0 μm and is more preferably about 10 μm. This description of scrub marks assumes Al or Cu contact pads.

Figure 24:
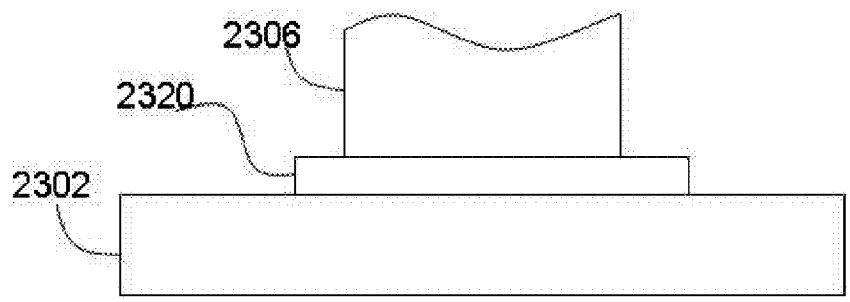
FIG. 24 shows a close up view of a probe tip making contact to a contact pad according to an embodiment of the invention.

FIG. 24 shows a close up view of a probe tip in contact with a contact pad. More specifically, probe tip 2306 makes contact with contact pad 2320 on a circuit (or device) 2402. Note that the view of FIG. 24 (and of FIGS. 25 and 26) differs from the view of FIGS. 23a-b by a 90 degree rotation about the Z-axis. Thus moving left or right on FIGS. 24-26 corresponds to moving into or out of the page of FIG. 23.

Figure 25:
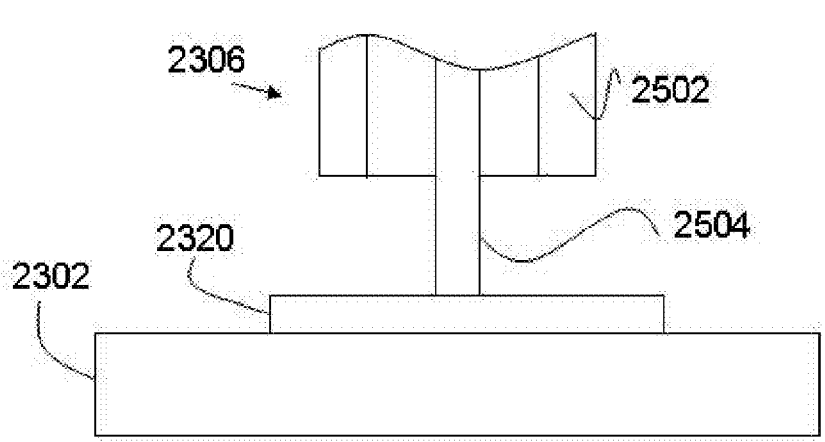
FIG. 25 shows a close up view of a probe tip making contact to a contact pad according to another embodiment of the invention.

FIG. 25 shows an alternative embodiment of the invention, where probe tip 2306 includes multiple layers (one of which is shown as 2502 and another of which is shown as 2504). Such a multilayer probe configuration provides several advantages. First, as shown on FIG. 25, one of the layers (2504 in this example) can extend past the others, thereby defining a "skate" having a width (i.e., y extent) substantially less than the width of probe tip 2306. Reducing the probe contact area can enhance scrub motion performance, because the force per unit area is thereby increased. However, decreasing the width of the entire probe can undesirably allow the probe to deflect in the y direction. A probe tip with a skate, as shown in FIG. 25, allows most of the probe to have a y-thickness sufficient to render y-deflection negligible, while also desirably reducing the contact area.

A further advantage of the multi-layer skate configuration of FIG. 25 is that only the skate layer (i.e., layer 2504) should be a material selected for suitability as a tip contacting material. The remaining layers (e.g., 2502) can be selected to optimize the overall probe performance without regard for their suitability as tip materials, since they never actually make contact with contact pad 2320.

Figure 26:
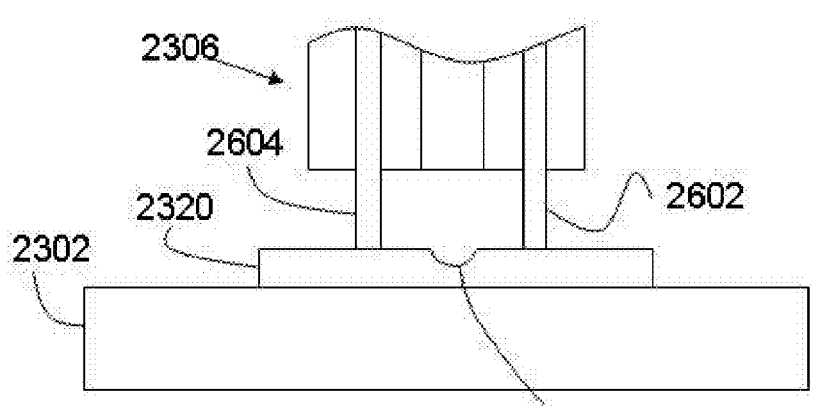
FIG. 26 shows a close up view of a probe tip making contact to a contact pad according to yet another embodiment of the invention.

FIG. 26 shows a dual-skate configuration, where probe tip 2306 includes two skates 2602 and 2604. This dual skate configuration is suitable for probing a contact pad 2320 having a dimple 2606 at its center. Such a dimple is characteristic of contact pads formed by metal plating (e.g. as in flip-chip wafers). Typical dimple dimensions are about 10 μm diameter on a contact pad having a 110 μm diameter, with the size of the dimple depending on the pitch of the contact pads. A single skate configuration as in FIG. 25 will undesirably require a choice between probing at the dimple location (which can degrade the electrical contact made by the probe), or off-center probing (which can be difficult to align). Probing at the dimple can also cause high mechanical stress on the probe if the probe tip gets caught by the dimple. In contrast, the dual-skate approach of FIG. 26 avoids probing the dimple, but still has the probe tip centered on the contact, thereby simplifying automatic probe alignment.

Figure 27A:
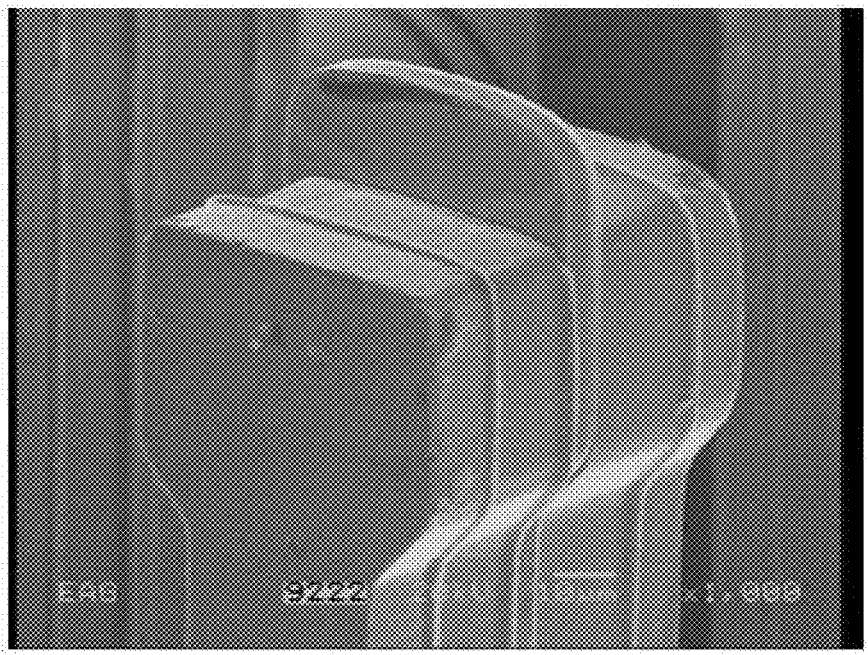
FIG. 27a shows a photograph of a probe tip.
Figure 27B:
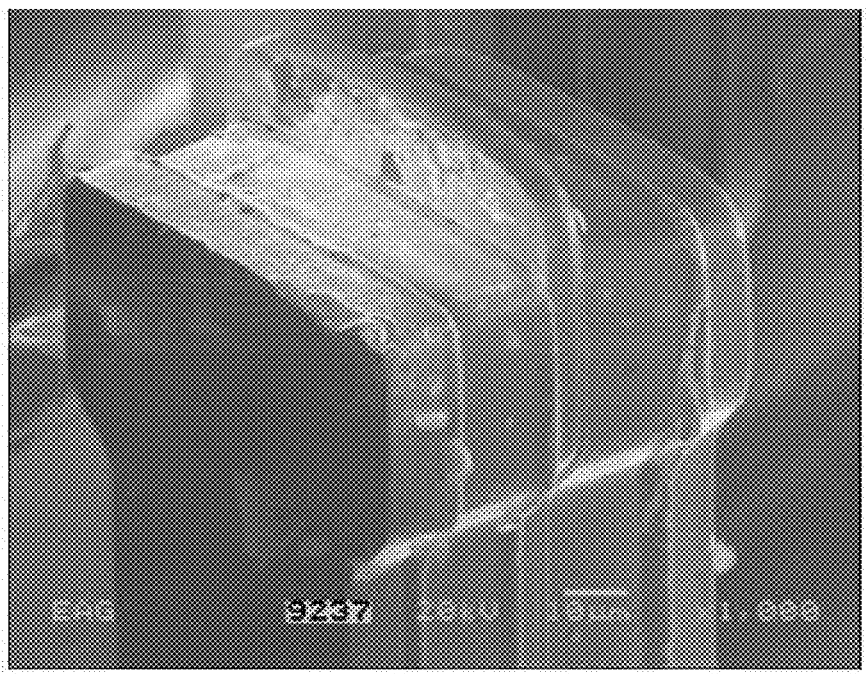
FIG. 27b shows a photograph of the probe tip of FIG. 27a after 1,000,000 probing cycles according to an embodiment of the invention.
Figure 28A:
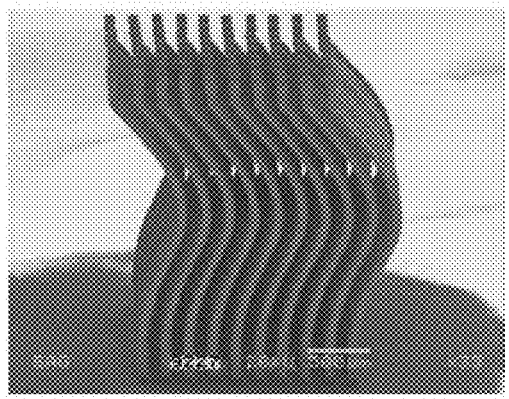
FIGS. 28a-d are photographs of probe array configurations suitable for use with embodiments of the invention.
Figure 28B:
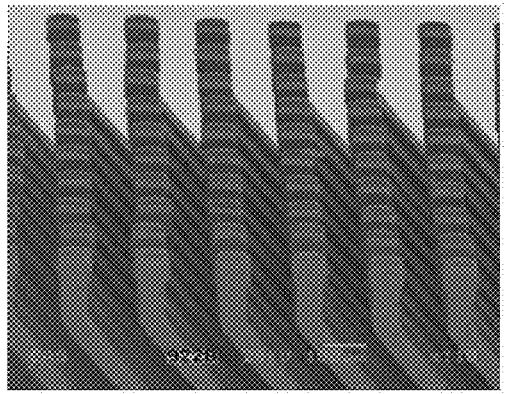
Figure 28C:
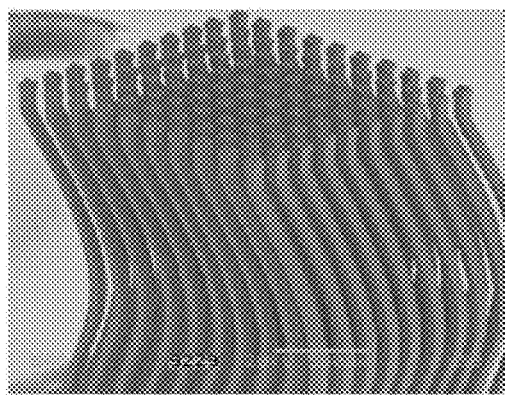
Figure 28D:
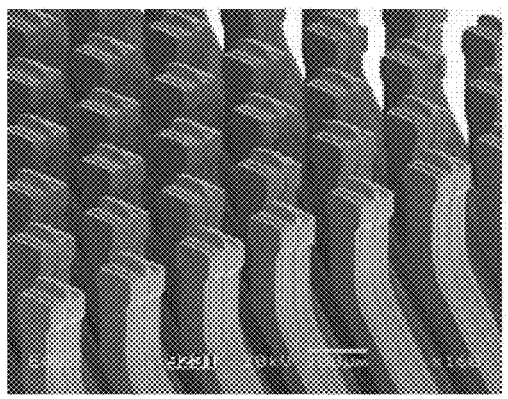

FIGS. 27a-b show results from an embodiment of the invention. More specifically, FIG. 27a is a photograph of a probe tip and FIG. 27b s a picture of the probe tip of FIG. 27a after 1,000,000 probing cycles according to the invention. The probe of this example is a multi-layer single-skate configuration, as in FIG. 25. FIG. 27b shows no significant degradation of the probe tip, either by wear or by accumulation of debris.

FIGS. 28a-d are photographs of a probe array suitable for practicing the invention. Such arrays are often required in practice, since many circuits being tested have a large number of contact pads which must be probed. For probe arrays, it is important that each probe deform in a uniform and predictable manner when the contact force is applied, to prevent probe-to-probe contact resulting from probe deflection. Thus it is preferred for the probe configuration of FIGS. 23a-b to only deform in the X-Z plane responsive to the contact force, as also indicated above in connection with probe tip skates.

Figure 30:
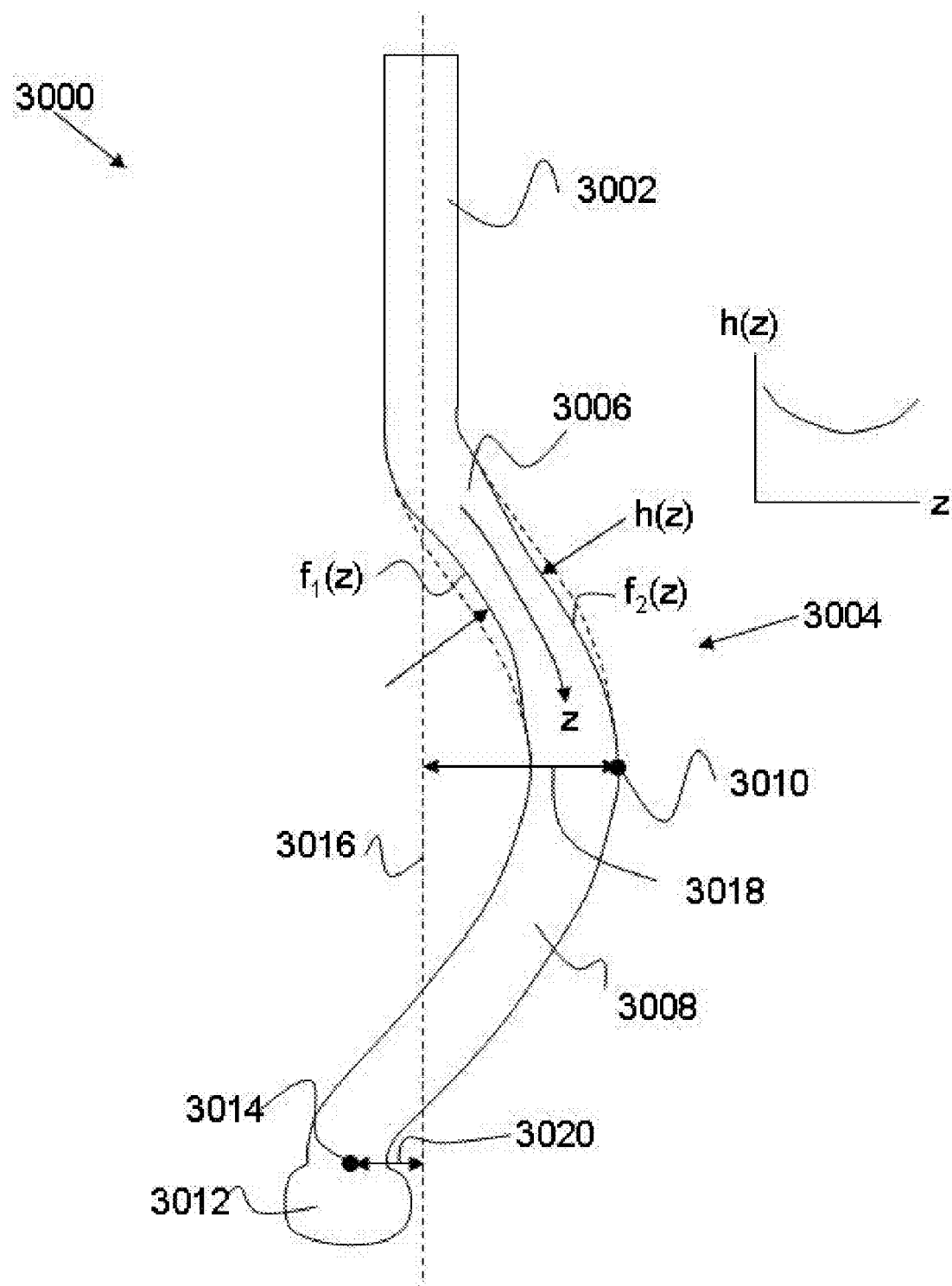
FIG. 30 shows a probe according to a first embodiment of the invention.

FIG. 30 shows a probe 3000 according to an embodiment of the invention. A shank 3002 defines a probe axis 3016. A curved knee section 3004 is connected to shank 3002 and includes an upper knee section 3006 and a lower knee section 3008. A probe tip 3012 is connected to an end of knee section 3004 opposite from the shank. Upper knee section 3006 extends outward from shank 3002 and reaches a knee point 3010 of maximum separation from probe axis 3016, thereby defining a lateral knee offset 3018 from the probe axis. Lower knee section 3008 extends from knee point 3010 toward probe axis 3016 and to a tip location 3014, thereby defining a lateral tip offset 3020 from the probe axis.

A probe plane includes and is thereby defined by probe axis 3016 and knee point 3010. In this example, the plane of FIG. 30 is the probe plane. A thickness of upper knee section 3006 in the probe plane varies along the length of the upper knee section according to a thickness function h(z), where z is position along the probe. The upper knee section includes a reduced thickness section, as described above. More specifically, h(z) has a local minimum located between shank 3002 and knee point 3010, as shown in the example of FIG. 30.

Suitable materials for shank 3002, knee section 3004 and probe tip 3012 are well known in the art, and any such materials can be employed in practicing the invention. Suitable tip materials are electrically conductive and wear-resistant, and include Rh and Cr. Known probe fabrication methods are applicable for fabricating embodiments of the invention. These methods include, but are not limited to, standard multilayer metal deposition techniques such as plating, sputtering, photolithographic techniques and microelectromechanical systems (MEMS) techniques. No unusual fabrication difficulties due to the reduced thickness section arise in fabricating probes according to the invention.

Preferably, h(z) varies smoothly (i.e., h(z) is preferably continuous with a continuous first derivative) to avoid stress concentration at discontinuities and/or sharp corners of h(z). It is also preferred for the minimum probe thickness (i.e., the local minimum of h(z)) to have a value between about 0.5 $h_{nom}$ and about 0.95 $h_{nom}$, where $h_{nom}$ is a nominal in-plane probe thickness. In some cases (e.g., as on FIG. 30, lower probe section 3008 has a roughly constant thickness $h_1$, and in such cases, $h_{nom}$ can equal $h_1$. In other cases, the nominal probe thickness $h_{nom}$ can be taken to be the maximum value of h(z) (i.e., the maximum thickness of the upper knee section). In either of these two cases, the nominal in-plane probe thickness $h_{nom}$ is typically between about 25 μm and about 55 μm, although the invention can also be practiced outside of this thickness range.

Preferably, h(z) varies smoothly along the entire length of upper knee section 3006, in order to minimize stress concentration for a given minimum thickness. It is also preferred for the probe thickness perpendicular to the probe plane to be somewhat higher than the nominal in-plane probe thickness, so that deformation of the probe is easiest in the probe plane. More specifically, the out of plane thickness is preferably between about 1.1 $h_{nom}$ and about 1.5 $h_{nom}$.

For a configuration with a small knee offset and large tip offset one can expect a longer scrub length. For a configuration with large knee offset and small tip offset, a shorter scrub length is expected. Preferred probe design approaches depend on the friction between probe and contact pad. For large contact friction, probe designs that generate larger horizontal reaction force typically produced with larger scrub length are preferred. For smoother, less frictional contact pad surfaces, probe designs producing a shorter scrub length are preferred.

Figure 37:
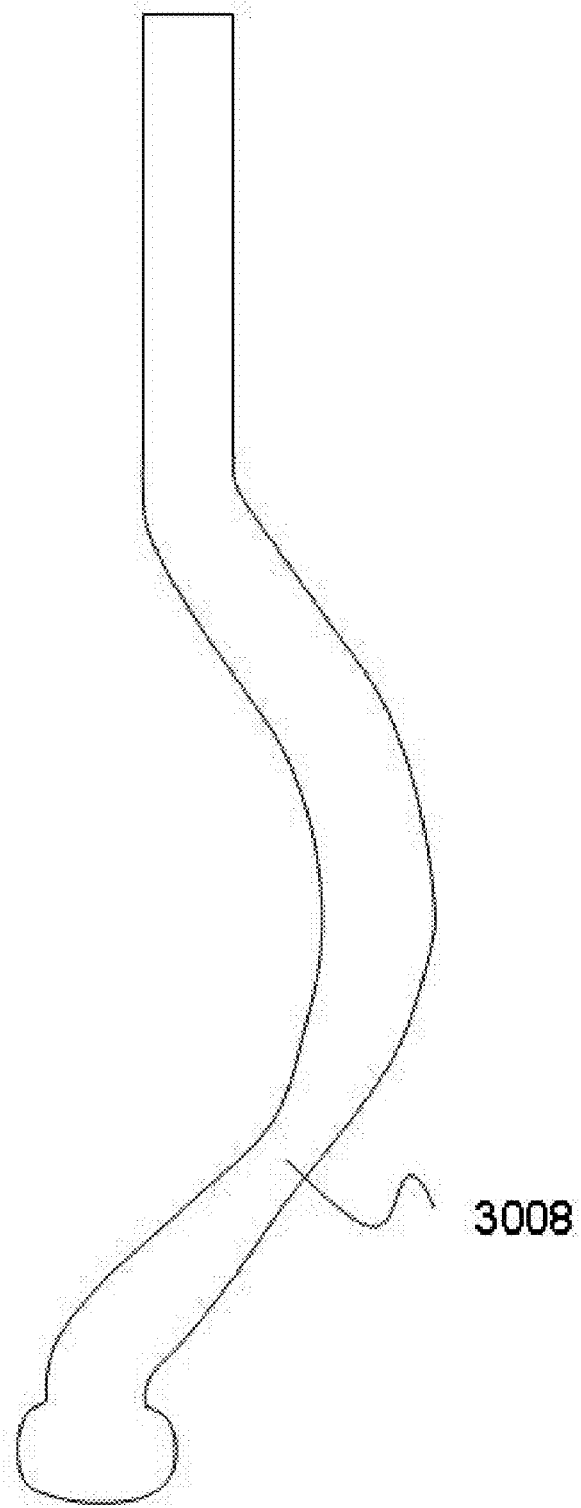
FIG. 37 shows a probe according to another embodiment of the invention.

Preferably, the reduced thickness section is in the upper knee section as shown and described above, although the invention can also be practiced by having the reduced thickness section anywhere along the length of knee section 3004. Placing the reduced thickness section in the upper knee section tends to decrease scrub motion without appreciably decreasing the contact force, while placing the reduced thickness section in the lower knee section (e.g., as shown on FIG. 37 tends to decrease both scrub motion and contact force. More specifically, a negative tip offset probe having an upper knee section reduced thickness section tends to rotate toward the knee during deflection, thereby decreasing scrub motion.

A probe having a lower knee section reduced thickness section tends to have increased flexibility (which reduces contact force). This reduced horizontal scrubbing force decreases the scrub motion. Probes having multiple reduced thickness sections can also be employed (e.g., one being in the upper knee section and the other being in the lower knee section) in practicing the invention.

Figures 31, 32:
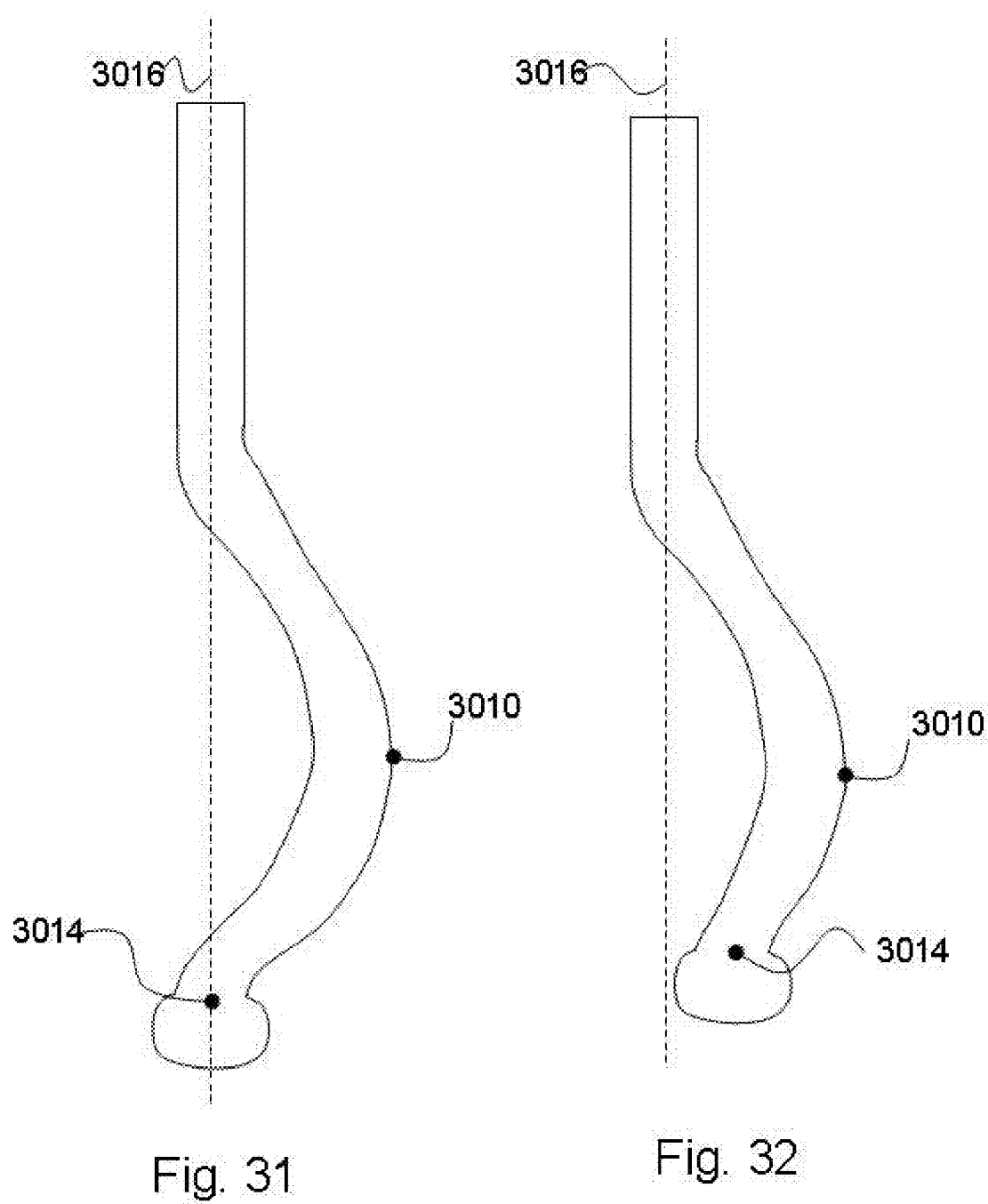
FIGS. 31-32 show alternate embodiments of the invention having different tip offsets.

As described above, the invention is applicable to probes having a positive tip offset, a negative tip offset, or no tip offset. The example of FIG. 30 shows a probe having a negative tip offset. Here probe axis 3016 is between knee point 3010 and tip location 3014. FIG. 31 shows an embodiment of the invention having no tip offset. Here tip location 3014 is substantially on probe axis 3016. FIG. 32 shows an embodiment of the invention having a positive tip offset. Here tip location 3014 is between probe axis 3016 and knee point 3010. For the probe of FIG. 32, the knee section does not cross the probe axis.

Figure 33:
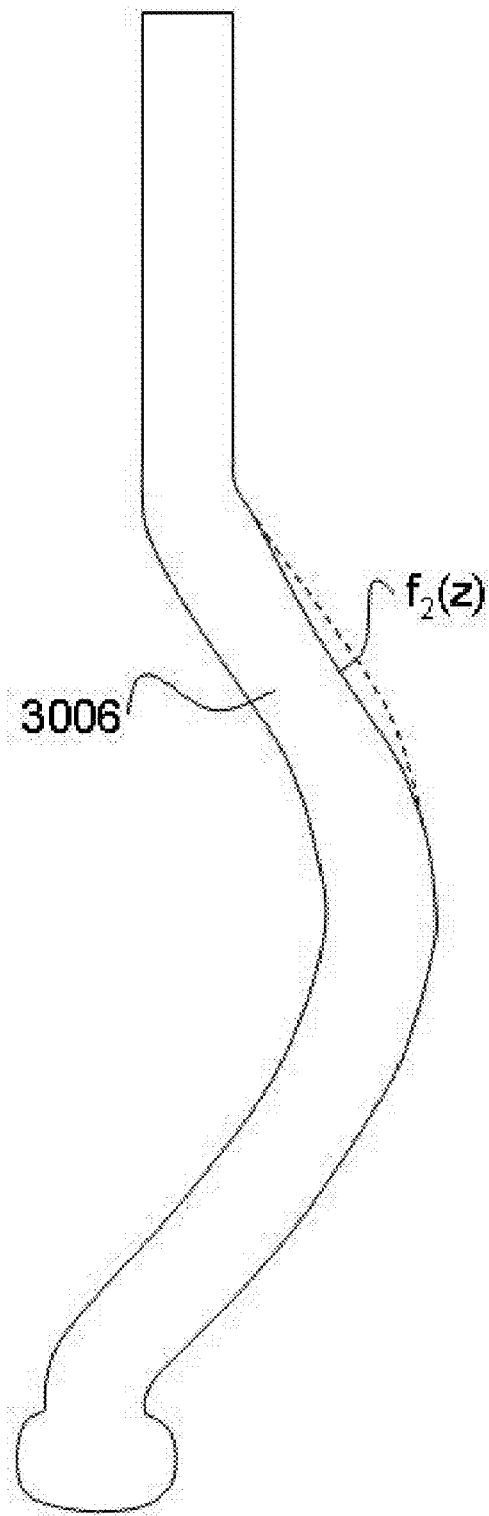
FIGS. 33-34 show alternate embodiments of the invention having different upper knee section thickness profiles.
Figure 34:
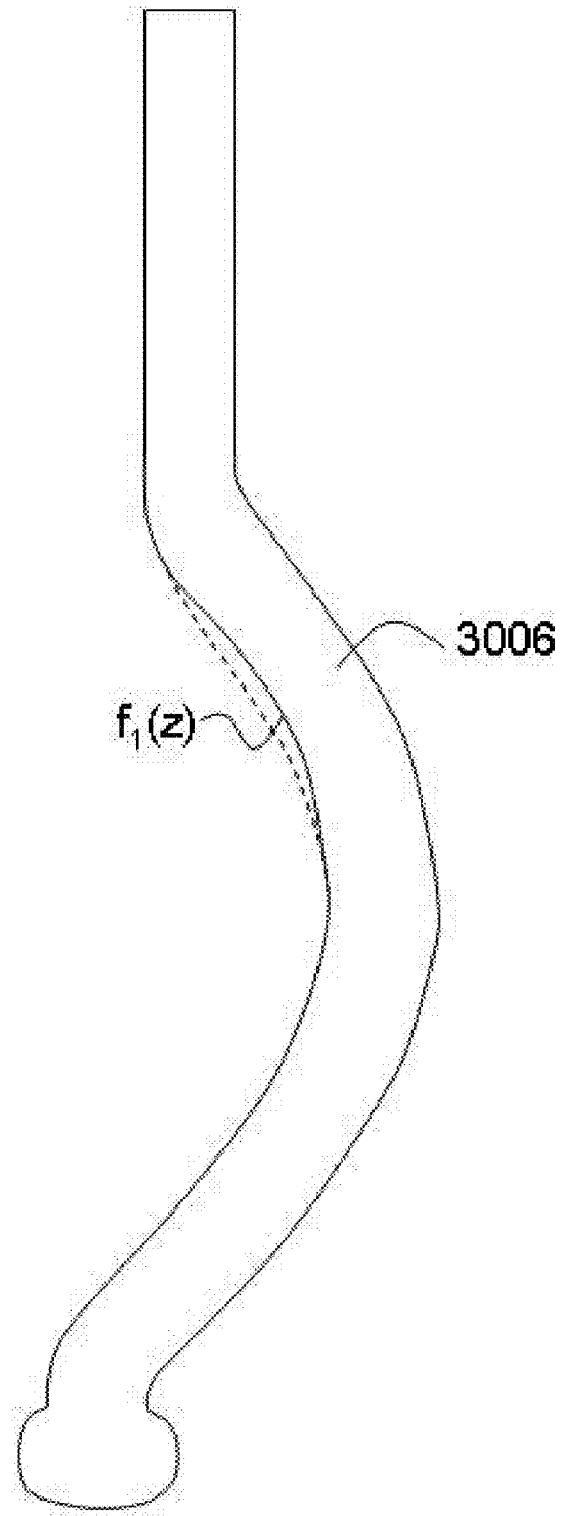

Reduced thickness sections of probes according to the invention can be regarded as resulting from removing material from the left and/or right sides of a smooth, constant-thickness probe profile. For example, FIG. 33 shows an embodiment of the invention where the reduced thickness section is formed by variation of a right probe boundary $f_2(z)$. FIG. 34 shows an embodiment of the invention where the reduced thickness section is formed by variation of a left probe boundary $f_1(z)$. FIG. 30 shows an embodiment of the invention where the reduced thickness section is formed by variation of both a left probe boundary $f_1(z)$ and a right probe boundary $f_2(z)$.

Figure 35:
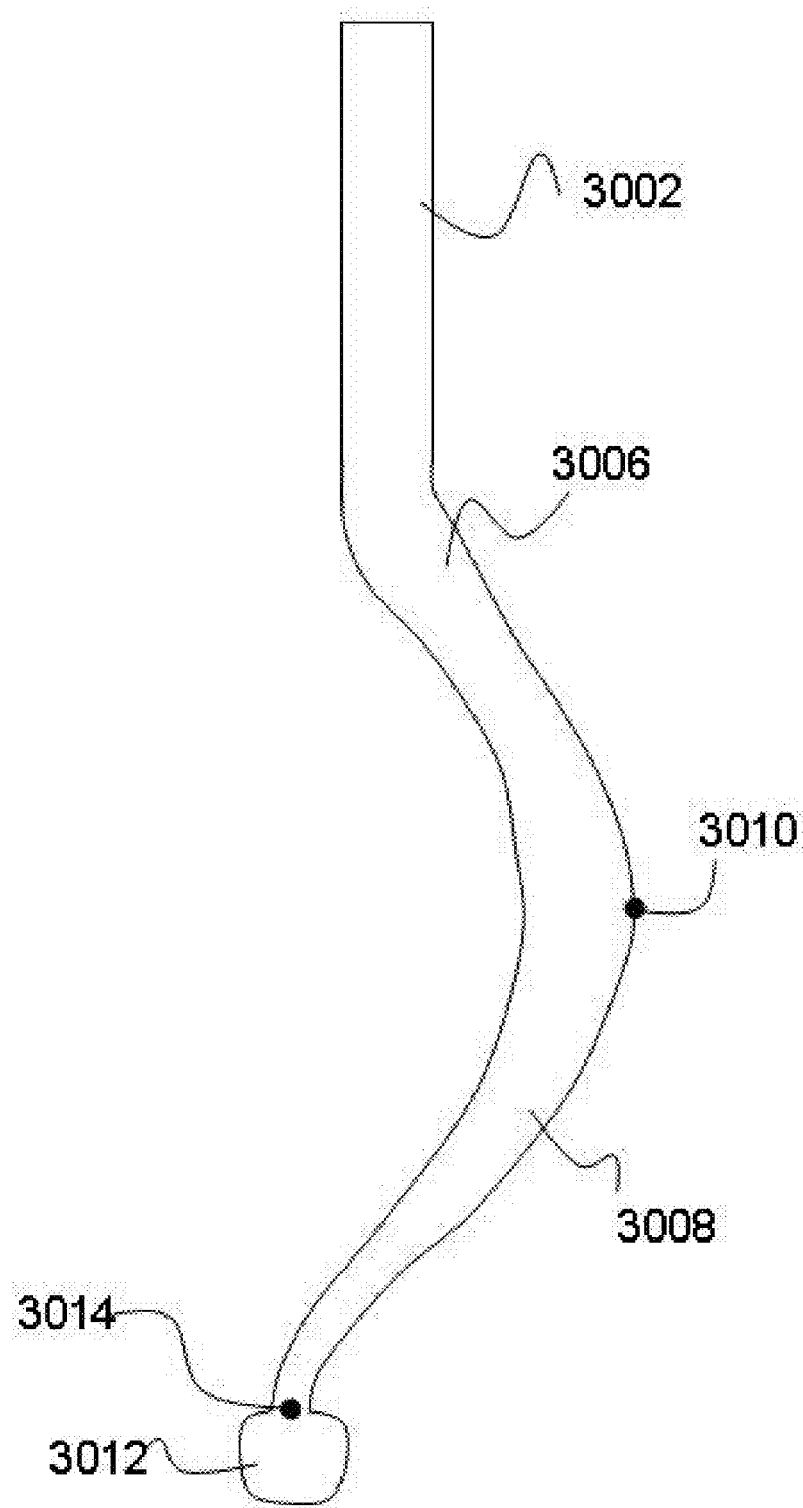
FIG. 35 shows an embodiment of the invention having a tapered lower knee section.

In the preceding examples, lower knee section 3008 has a roughly constant in-plane thickness. The detailed shape of lower knee section 3008 is not critical in practicing the invention and any other lower knee section shape can also be employed in practicing the invention. For example, FIG. 35 shows an embodiment of the invention having a tapered lower knee section 3008. More specifically, the in-plane thickness of lower knee section 3008 decreases monotonically along the length of the lower knee section from knee point 3010 to the tip location 3014.

Figures 36A, 36B:
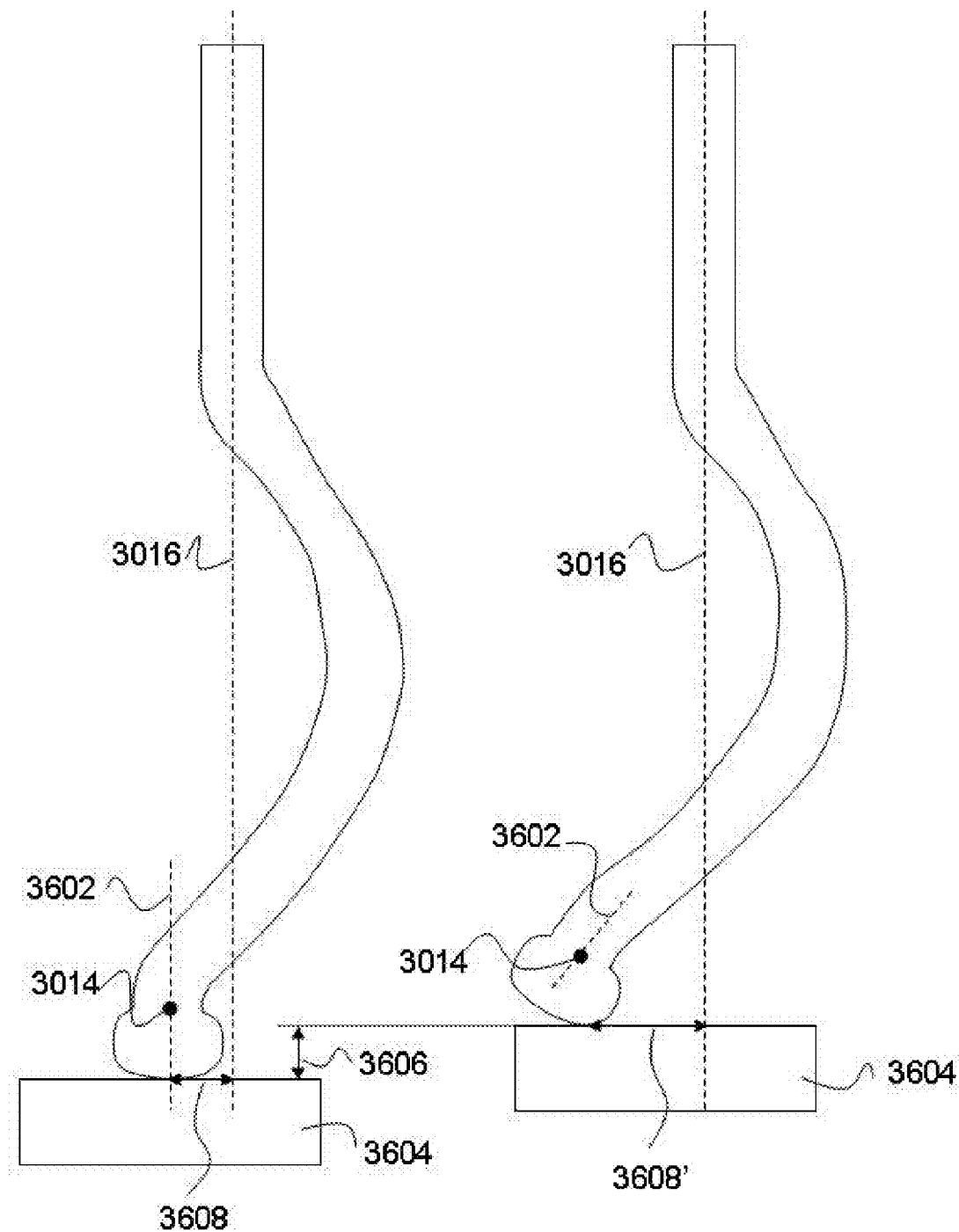
FIG. 36a shows an embodiment of the invention in an initial contact configuration.
FIG. 36b shows an embodiment of the invention in an operating contact configuration.

Operation of the invention can be appreciated in connection with FIGS. 36a-b, which show an embodiment of the invention in an initial contact configuration and an operating contact configuration respectively. On FIG. 36a a probe according to the invention makes initial contact with a contact pad 3604. It is convenient to describe the initial contact point between the probe and contact pad 3604 in terms of an initial contact offset 3608 defined with respect to probe axis 3016. In operation, the arrangement of FIG. 36a is vertically compressed (e.g., by moving contact pad 3604 up by a vertical deflection 3606. Under this compression, the probe elastically deforms as schematically shown on FIG. 36b. As a result of this deformation, the probe tip moves relative to contact pad 3604. Typically this relative motion includes a translation (i.e., operating contact offset 3608' being different from initial contact offset 3608 and a rocking motion of the probe tip relative to the contact pad surface. The rocking motion can be appreciated by noting the different orientations of a tip axis 3602 on FIGS. 36a and 36b. The scrub mark length is the difference between offset 3608 and offset 3608'.

In one example, a reference probe (probe A) having a nominal in-plane probe thickness of 52 μm and a negative tip offset (as shown on FIG. 30), provided a 25 μm scrub length on an Al surface for 75 μm vertical deflection. A probe according to the invention (probe B) had the same shape as the reference probe, except that the upper knee section of probe B smoothly varied to provide a local minimum thickness of 33 μm in the upper knee section. This local minimum was located about halfway between the knee point and the shank.

The thickness variation of the upper knee section was distributed over the entire length of the upper knee section. Probe B provided a 10 μm scrub length on the same Al surface used for testing probe A. For both probes A and B, the contact force was about the same (2 grams per 25 μm vertical deflection).

The invention claimed is:

1. A probe for probing a device under test, the probe comprising:
    a shank defining a probe axis;
    a curved knee section connected to the shank and including an upper knee section and a lower knee section;
    a probe tip connected to an end of the knee section opposite from the shank;
    wherein the upper knee section extends outward from the shank and reaches a knee point of maximum separation from the probe axis, thereby defining a lateral knee offset from the probe axis;
    wherein the lower knee section extends from the knee point to a tip location, thereby defining a lateral tip offset from the probe axis;
    wherein a probe plane is defined by the probe axis and the knee point;
    wherein a thickness of the knee section in the probe plane has a local minimum between the shank and the tip location;
    wherein said probe axis is between said knee point and said tip location; and
    wherein said thickness of the knee section in the probe plane has a maximum value between about 25 μm and about 55 μm.

2. The probe of claim 1, wherein said thickness of the knee section in the probe plane varies continuously along a length of said probe.

3. The probe of claim 1 wherein said thickness of the knee section in the probe plane is the separation between a left probe boundary and a right probe boundary.

4. The probe of claim 3, wherein variation of said thickness of the knee section in the probe plane is substantially due to variation of said left probe boundary.

5. The probe of claim 3, wherein variation of said thickness of the knee section in the probe plane is substantially due to variation of said right probe boundary.

6. The probe of claim 3, wherein variation of said thickness of the knee section in the probe plane is due to both variation of said left probe boundary and to variation of said right probe boundary.

7. The probe of claim 1, wherein said local minimum is between about 50% of and about 95% of a maximum thickness of said knee section in the probe plane.

8. The probe of claim 1, wherein a thickness of said lower knee section in the probe plane decreases monotonically along the length of the lower knee section from said knee point to said tip location.

9. The probe of claim 1, wherein a thickness of said lower knee section in the probe plane is substantially constant along the length of the lower knee section.

10. The probe of claim 9, wherein said local minimum is between about 50% of and about 95% of said constant thickness of said lower knee section.

11. The probe of claim 9, wherein said constant thickness of said lower knee section is between about 25 μm and about 55 μm.

12. The probe of claim 1, wherein said local minimum of said thickness of the knee section in the probe plane is disposed between said shank and said knee point.

13. The probe of claim 1, wherein said local minimum of said thickness of the knee section in the probe plane is disposed between said knee point and said tip location.

14. A probe for probing a device under test, the probe comprising:
    a shank defining a probe axis;
    a curved knee section connected to the shank and including an upper knee section and a lower knee section;
    a probe tip connected to an end of the knee section opposite from the shank;
    wherein the upper knee section extends outward from the shank and reaches a knee point of maximum separation from the probe axis, thereby defining a lateral knee offset from the probe axis;
    wherein the lower knee section extends from the knee point to a tip location, thereby defining a lateral tip offset from the probe axis;
    wherein a probe plane is defined by the probe axis and the knee point;
    wherein a thickness of the knee section in the probe plane has a local minimum between the shank and the tip location; and
    wherein said thickness of the knee section in the probe plane has a maximum value between about 25 μm and about 55 μm.

15. The probe of claim 14, wherein said thickness of the knee section in the plane varies continuously along a length of said probe.

16. The probe of claim 14, wherein a thickness of said lower knee section in the probe plane decreases monotonically along the length of the lower knee section from said knee probe to said tip location.

17. The probe of claim 14, wherein a thickness of said lower knee section in the probe plane is substantially constant along the length of the lower knee section.

18. A probe for probing a device under test, the probe comprising:
    a shank defining a probe axis;
    a curved knee section connected to the shank and including an upper knee section and a lower knee section;
    a probe tip connected to an end of the knee section opposite from the shank;
    wherein the upper knee section extends outward from the shank and reaches a knee point of maximum separation from the probe axis, thereby defining a lateral knee offset from the probe axis;
    wherein the lower knee section extends from the knee point to a tip location, thereby defining a lateral tip offset from the probe axis;
    wherein a probe plane is defined by the probe axis and the knee point;
    wherein a thickness of the knee section in the probe plane has a local minimum between the shank and the tip location; and
    wherein a thickness of said lower knee section in the probe plane decreases monotonically along the length of the lower knee section from said knee point to said tip location.

19. The probe of claim 18, wherein said probe axis is between said knee point and said tip location.

20. The probe of claim 18, wherein said tip location is between said knee point and said probe axis.

21. The probe of claim 18, wherein said tip location is substantially on said probe axis.

22. A probe for probing a device under test, the probe comprising:
- a shank defining a probe axis;
- a curved knee section connected to the shank and including an upper knee section and a lower knee section;
- a probe tip connected to an end of the knee section opposite from the shank;
- wherein the upper knee section extends outward from the shank and reaches a knee point of maximum separation from the probe axis, thereby defining a lateral knee offset from the probe axis;
- wherein the lower knee section extends from the knee point to a tip location, thereby defining a lateral tip offset from the probe axis;
- wherein a probe plane is defined by the probe axis and the knee point;
- wherein a thickness of the knee section in the probe plane has a local minimum between the shank and the tip location;
- wherein a thickness of said lower knee section in the probe plane is substantially constant along the length of the lower knee section; and
- wherein said constant thickness of said lower knee section is between about 25 µm and about 55 µm.

23. A probe for probing a device under test, the probe comprising:
- a shank defining a probe axis;
- a curved knee section connected to the shank and including an upper knee section and a lower knee section;
- a probe tip connected to an end of the knee section opposite from the shank;
- wherein the upper knee section extends outward from the shank and reaches a knee point of maximum separation from the probe axis, thereby defining a lateral knee offset from the probe axis;
- wherein the lower knee section extends from the knee point to a tip location, thereby defining a lateral tip offset from the probe axis;
- wherein a probe plane is defined by the probe axis and the knee point;
- wherein a thickness of the knee section in the probe plane has a local minimum between the shank and the tip location;
- wherein said probe axis is between said knee point and said tip location; and
- wherein a thickness of said lower knee section in the probe plane decreases monotonically along the length of the lower knee section from said knee point to said tip location.

24. The probe of claim 23, wherein said thickness of the knee section in the probe plane varies continuously along a length of said probe.

25. The probe of claim 23, wherein said thickness of the knee section in the probe plane is the separation between a left probe boundary and a right probe boundary.

26. The probe of claim 25, wherein variation of said thickness of the knee section in the probe plane is substantially due to variation of said left probe boundary.

27. The probe of claim 25, wherein variation of said thickness of the knee section in the probe plane is substantially due to variation of said right probe boundary.

28. The probe of claim 25, wherein variation of said thickness of the knee section in the probe plane is due to both variation of said left probe boundary and to variation of said right probe boundary.

29. The probe of claim 23, wherein said local minimum is between about 50% of and about 95% of a maximum thickness of said knee section in the probe plane.

30. The probe of claim 23, wherein said thickness of the knee section in the probe plane has a maximum value between about 25 µm and about 55 µm.

31. The probe of claim 23, wherein said local minimum of said thickness of the knee section in the probe plane is disposed between said shank and said knee point.

32. The probe of claim 23, wherein said local minimum of said thickness of the knee section in the probe plane is disposed between said knee point and said tip location.

33. A probe for probing a device under test, the probe comprising:
- a shank defining a probe axis;
- a curved knee section connected to the shank and including an upper knee section and a lower knee section;
- a probe tip connected to an end of the knee section opposite from the shank;
- wherein the upper knee section extends outward from the shank and reaches a knee point of maximum separation from the probe axis, thereby defining a lateral knee offset from the probe axis;
- wherein the lower knee section extends from the knee point to a tip location, thereby defining a lateral tip offset from the probe axis;
- wherein a probe plane is defined by the probe axis and the knee point;
- wherein a thickness of the knee section in the probe plane has a local minimum between the shank and the tip location;
- wherein said probe axis is between said knee point and said tip location; and
- wherein a thickness of said lower knee section in the probe plane is substantially constant and is between 25 µm and about 55 µm along the length of the lower knee section.

34. The probe of claim 33, wherein said thickness of the knee section in the probe plane is the separation between a left probe boundary and a right probe boundary.

35. The probe of claim 34, wherein variation of said thickness of the knee section in the probe plane is substantially due to variation of said left probe boundary.

36. The probe of claim 34, wherein variation of said thickness of the knee section in the probe plane is substantially due to variation of said right probe boundary.

37. The probe of claim 34, wherein variation of said thickness of the knee section in the probe plane is due to both variation of said left probe boundary and to variation of said right probe boundary.

38. The probe of claim 33, wherein said local minimum is between about 50% of and about 95% of a maximum thickness of said knee section in the probe plane.

39. The probe of claim 33, wherein said thickness of the knee section in the probe plane has a maximum value between about 25 µm and about 55 µm.

40. The probe of claim 33, wherein said local minimum is between about 50% of and about 95% of said constant thickness of said lower knee section.

41. The probe of claim 33, wherein said local minimum of said thickness of the knee section in the probe plane is disposed between said shank and said knee point.

42. The probe of claim 33, wherein said local minimum of said thickness of the knee section in the probe plane is disposed between said knee point and said tip location.

* * * * *